US010659007B2

(12) United States Patent
Wada et al.

(10) Patent No.: US 10,659,007 B2
(45) Date of Patent: May 19, 2020

(54) TUNABLE FILTER, RADIO FREQUENCY FRONT-END CIRCUIT, AND COMMUNICATION APPARATUS

(71) Applicant: Murata Manufacturing Co., Ltd., Kyoto (JP)

(72) Inventors: Takaya Wada, Kyoto (JP); Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 108 days.

(21) Appl. No.: 15/956,032

(22) Filed: Apr. 18, 2018

(65) Prior Publication Data
US 2018/0234078 A1  Aug. 16, 2018

Related U.S. Application Data

(63) Continuation of application No. PCT/JP2016/080464, filed on Oct. 14, 2016.

(30) Foreign Application Priority Data

Oct. 19, 2015  (JP) .................................. 2015-205356
Mar. 22, 2016  (JP) .................................. 2016-056863

(51) Int. Cl.
H03H 9/64 (2006.01)
H03H 9/58 (2006.01)
H03H 9/02 (2006.01)

(52) U.S. Cl.
CPC ............ *H03H 9/6403* (2013.01); *H03H 9/58* (2013.01); *H03H 9/6406* (2013.01);
(Continued)

(58) Field of Classification Search
CPC .. H03H 9/6406; H03H 9/6403; H03H 9/6483; H03H 9/58; H03H 2009/02165;
(Continued)

(56) References Cited

U.S. PATENT DOCUMENTS 6,472,953 B1 * 10/2002 Sakuragawa ........ H03H 9/6483
                                                      333/133
6,525,624 B1 *  2/2003 Hikita .................. H03H 7/0161
                                                      333/133
(Continued)

FOREIGN PATENT DOCUMENTS

JP  01-265711 A   * 10/1989
JP  H11-340779 A    12/1999
(Continued)

OTHER PUBLICATIONS

International Search Report for International Application No. PCT/JP2016/080464, dated Nov. 15, 2016.
(Continued)

*Primary Examiner* — Barbara Summons
(74) *Attorney, Agent, or Firm* — Pearne & Gordon LLP

(57) ABSTRACT

A tunable filter includes a series-arm resonant circuit, and a parallel-arm resonant circuit. The series-arm resonant circuit includes a group of acoustic wave resonant circuits that have different resonant frequencies, a variable capacitor, and switching circuits. The parallel-arm resonant circuit includes another group of acoustic wave resonant circuits that have different resonant frequencies, a variable capacitor, and switching circuits. For example, the difference in pass-band frequency caused by the difference in resonant frequency between the acoustic wave resonant circuit in the group and the acoustic wave resonant circuit in the other group is greater than the maximum difference in pass-band frequency resulting from the variable range of capacitance of the variable capacitor.

9 Claims, 13 Drawing Sheets

(52) U.S. Cl.
CPC ........ *H03H 9/6423* (2013.01); *H03H 9/6483* (2013.01); *H03H 2009/02165* (2013.01); *H03H 2210/025* (2013.01); *H03H 2210/033* (2013.01); *H03H 2210/036* (2013.01)

(58) Field of Classification Search
CPC ....... H03H 2210/025; H03H 2210/033; H03H 2210/036; H03H 9/542; H03H 9/545; H03H 9/568; H03H 9/605; H03H 2210/012; H03H 9/60; H03H 9/64; H03H 9/6423
USPC .................................. 333/189, 193, 195, 133
See application file for complete search history.

(56) References Cited

U.S. PATENT DOCUMENTS

| | | | | |
|---|---|---|---|---|
| 9,130,505 | B2* | 9/2015 | Zuo | ...................... H03B 5/1243 |
| 10,200,012 | B2* | 2/2019 | Tsukamoto | .......... H03H 9/0009 |
| 2007/0052494 | A1 | 3/2007 | Shibagaki et al. | |
| 2009/0201104 | A1 | 8/2009 | Ueda et al. | |
| 2012/0313731 | A1 | 12/2012 | Burgener et al. | |
| 2012/0326810 | A1 | 12/2012 | Omura | |
| 2013/0257558 | A1 | 10/2013 | Kim | |
| 2014/0010122 | A1 | 1/2014 | Krems et al. | |
| 2016/0197643 | A1 | 7/2016 | Uejima | |
| 2016/0344364 | A1* | 11/2016 | Ogami | .................. H03H 9/605 |
| 2016/0352310 | A1 | 12/2016 | Tani et al. | |

FOREIGN PATENT DOCUMENTS

| | | |
|---|---|---|
| JP | 2007-074459 A | 3/2007 |
| JP | 2009-207116 A | 9/2009 |
| JP | 2014-501467 A | 1/2014 |
| JP | 2014-502803 A | 2/2014 |
| KR | 10-2013-0112307 A | 10/2013 |
| WO | 2011/111425 A1 | 9/2011 |
| WO | 2012/114930 A1 | 8/2012 |
| WO | 2015/041125 A1 | 3/2015 |
| WO | 2015/119176 A1 | 8/2015 |

OTHER PUBLICATIONS

Written Opinion for International Application No. PCT/JP2016/080464, dated Nov. 15, 2016.
Japanese Office Action for Application No. 2017-546522, dated May 21, 2019.

* cited by examiner

TUNABLE FILTER, RADIO FREQUENCY FRONT-END CIRCUIT, AND COMMUNICATION APPARATUS

This is a continuation of International Application No. PCT/JP2016/080464 filed on Oct. 14, 2016 which claims priority from Japanese Patent Application No. 2015-205356 filed on Oct. 19, 2015 and Japanese Patent Application No. 2016-056863 filed on Mar. 22, 2016. The contents of these applications are incorporated herein by reference in their entireties.

BACKGROUND

Technical Field

The present disclosure relates to a tunable filter including an acoustic wave resonator and a variable capacitor, a radio frequency (RF) front-end circuit including the tunable filter, and a communication apparatus including the tunable filter.

In related art, various tunable filters implemented by a combination of an acoustic wave resonator and a variable capacitor have been designed and put into use.

For instance, a tunable filter disclosed in Patent Document 1 includes a ladder network of multiple stages of acoustic wave resonant circuits, each including an acoustic wave resonator and a variable capacitor. The tunable filter disclosed in Patent Document 1 includes a series-arm resonant circuit and a parallel-arm resonant circuit that constitute the ladder network. The series-arm resonant circuit is a parallel circuit of an acoustic wave resonator and a variable capacitor, and the parallel-arm resonant circuit is a series circuit of an acoustic wave resonator and a variable capacitor.

Patent Document 1: International Publication Pamphlet No. 2012/114930

BRIEF SUMMARY

With the tunable filter disclosed in Patent Document 1, the resonant point or anti-resonant point of an acoustic wave resonator connected with a variable capacitor is tuned by the variable capacitor in a direction that decreases the difference in frequency between the resonant point and the anti-resonant point. This configuration limits the tunable frequency range of attenuation poles of the filter. This may make it difficult for such a filter to be adapted to many different communication bands (frequency bands defined by the 3GPP).

The present disclosure provides a tunable filter with an extended tunable frequency range to cover a broad range of frequencies.

The present disclosure relates to a tunable filter including a ladder connection of a series-arm resonant circuit and a parallel-arm resonant circuit, each having an acoustic wave resonator and a variable capacitor. The tunable filter has the following features. At least one of the series-arm resonant circuit and the parallel-arm resonant circuit includes a first acoustic wave resonant circuit and a second acoustic wave resonant circuit that have resonant frequencies different from each other, and a switching circuit that selectively connects the first acoustic wave resonant circuit and the second acoustic wave resonant circuit to a variable capacitor. The difference in pass-band frequency caused by the difference in resonant frequency between the first acoustic wave resonant circuit and the second acoustic wave resonant circuit is greater than the maximum difference in pass-band frequency resulting from the variable range of capacitance of the variable capacitor.

This configuration allows the pass band to be tuned over a broad range of frequencies.

In a preferred configuration of the tunable filter according to the present disclosure, if the tuning range of the pass-band frequency is equal to or less than the maximum difference in pass-band frequency provided by the maximum variable range of capacitance of the variable capacitor, the variable amount of capacitance of the variable capacitor is adjusted, and if the tuning range of the pass-band frequency is greater than the maximum difference in pass-band frequency provided by the maximum variable range of capacitance of the variable capacitor, the first acoustic wave resonant circuit and the second acoustic wave resonant circuit are switched by the switching circuit.

According to this configuration, a small change in pass-band frequency is made by adjustment of the capacitance of the variable capacitor, and a large change in pass-band frequency is made by selection of an acoustic wave resonant circuit by the switching circuit.

Further, the tunable filter according to the present disclosure is preferably configured as described below. The first acoustic wave resonant circuit or the second acoustic wave resonant circuit includes at least a first acoustic wave resonator and a second acoustic wave resonator. The first acoustic wave resonator and the second acoustic wave resonator are connected in parallel. The resonant frequency and anti-resonant frequency of the first acoustic wave resonator differ from the resonant frequency and anti-resonant frequency of the second acoustic wave resonator.

According to this configuration, the first acoustic wave resonant circuit or the second acoustic wave resonant circuit has a plurality of resonant points and a plurality of anti-resonant points. This makes it possible to easily obtain desired resonant and filter characteristics.

In a preferred configuration of the tunable filter according to the present disclosure, the series-arm resonant circuit and the parallel-arm resonant circuit, each includes the first acoustic wave resonant circuit and the second acoustic wave resonant circuit.

This makes it possible to easily obtain desired filter characteristics.

In a preferred configuration of the tunable filter according to the present disclosure, the first acoustic wave resonant circuit and the second acoustic wave resonant circuit, each includes the first acoustic wave resonator and the second acoustic wave resonator.

This configuration allows desired attenuation and band-pass characteristics to be obtained more reliably.

In a preferred configuration of the tunable filter according to the present disclosure, the acoustic wave resonators are connected in parallel.

This configuration helps minimize an increase in the impedance of the acoustic wave resonant circuit, thus allowing the tunable filter to be easily adapted to low-impedance circuits, such as a radio frequency front-end circuit.

In a preferred configuration of the tunable filter according to the present disclosure, the tunable filter further includes a reactance element, and a coupling variable capacitor. The reactance element is connected between a ground potential, and a variable capacitor of a parallel-arm resonant circuit that is connected to an output terminal without necessarily the series-arm resonant circuit interposed between the parallel-arm resonant circuit and the output terminal. The coupling variable capacitor is connected between an input terminal, and the connection point of the variable capacitor and the reactance element.

According to this configuration, the coupling variable capacitor is coupled to a variable capacitor in another resonant circuit, or a reactance element. This configuration extends the attenuation band that provides a predetermined amount of attenuation. That is, this configuration improves the attenuation characteristics of the tunable filter.

Further, the tunable filter according to the present disclosure is preferably configured as described below.

The conductor pattern of the acoustic wave resonator constituting the series-arm resonant circuit, and the conductor pattern of the acoustic wave resonator constituting the parallel-arm resonant circuit are arranged in a first direction of a piezoelectric. With respect to a second direction orthogonal to the first direction, an external-connection terminal conductor that connects the series-arm resonant circuit to the conductor pattern of an acoustic wave resonator is disposed adjacent to one end of a resonator-forming area, the resonator-forming area being an area where the conductor pattern of the acoustic wave resonator constituting the series-arm resonant circuit and the conductor pattern of the acoustic wave resonator constituting the parallel-arm resonant circuit are formed. With respect to the second direction, an external-connection terminal conductor that connects the parallel-arm resonant circuit to the conductor pattern of an acoustic wave resonator is disposed adjacent to the other end of the resonator-forming area.

This configuration can ensure that a circuit pattern that connects the series-arm resonant circuit to a switching circuit and a variable capacitor that are used for the series-arm resonant circuit, and a circuit pattern that connects the parallel-arm resonant circuit to a switching circuit and a variable capacitor that are used for the parallel-arm resonant circuit are not located in proximity to or cross each other.

A radio frequency front-end circuit according to the present disclosure includes the tunable filter according to any one of the above-mentioned configurations, with the tunable filter being used as the filter of a transmitting circuit or the filter of a receiving circuit.

This configuration allows communication signals of desired frequencies to be transmitted or received with low loss while suppressing unwanted waves of other frequencies, over a broad range of frequencies.

A communication apparatus according to the present disclosure includes the above-mentioned radio frequency front-end circuit, and a radio frequency integrated circuit connected to the transmitting circuit and the receiving circuit.

This configuration provides superior communication characteristics over a broad range of frequencies.

The present disclosure makes it possible to extend the tunable range of the pass-band center frequency of the filter, thus allowing the filter to be adapted to many different communication bands.

DETAILED DESCRIPTION

Figure 1:
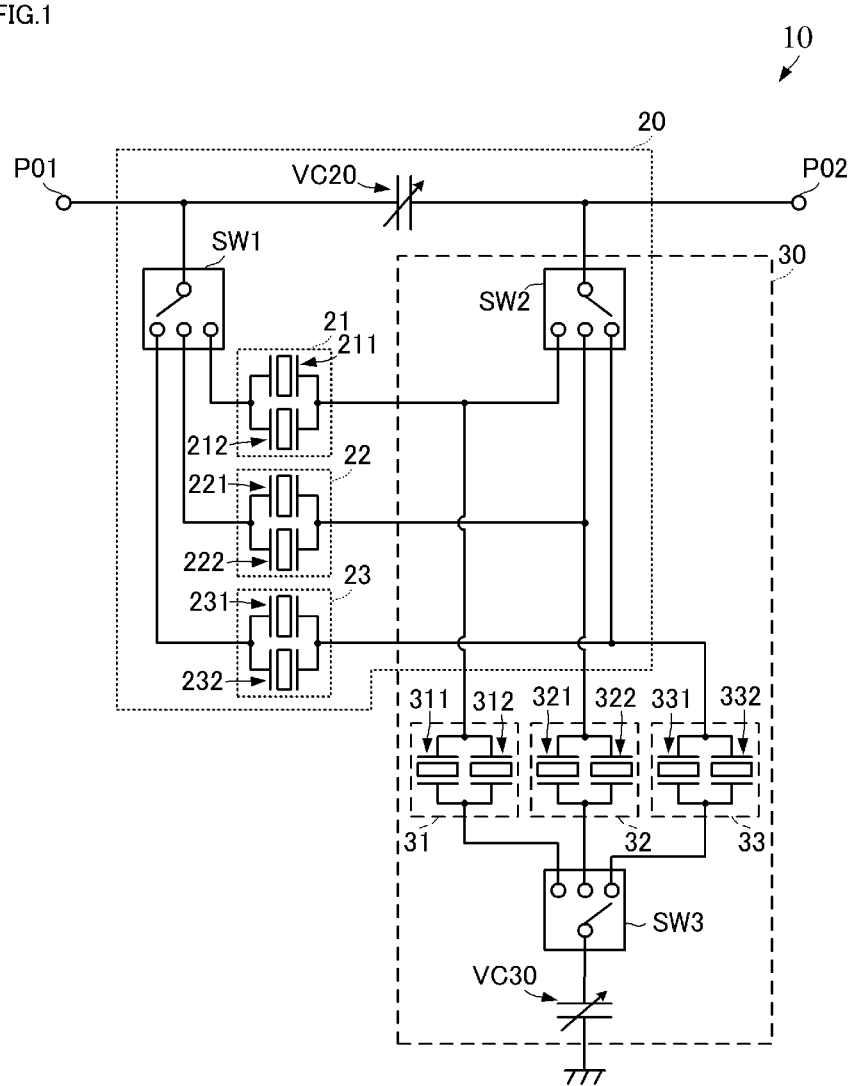
FIG. 1 is a circuit diagram of a tunable filter according to a first embodiment of the present disclosure.

A tunable filter according to a first embodiment of the present disclosure will be described below with reference to the drawings. FIG. 1 is a circuit diagram of the tunable filter according to the first embodiment of the present disclosure.

A tunable filter 10 includes a series-arm resonant circuit 20, and a parallel-arm resonant circuit 30. The series-arm resonant circuit 20 is connected between a first terminal P01 and a second terminal P02. The parallel-arm resonant circuit 30, which is partially in common with the series-arm resonant circuit 20, is connected between the side of the series-arm resonant circuit 20 adjacent to the second terminal P02, and the ground potential.

The series-arm resonant circuit 20 includes acoustic wave resonant circuits 21, 22, and 23, a variable capacitor VC20, and switching circuits SW1 and SW2. The acoustic wave resonant circuits 21, 22, and 23, each corresponds to "first acoustic wave resonant circuit" and "second acoustic wave resonant circuit" according to the present disclosure.

One end of the variable capacitor VC20 is connected to the first terminal P01. The other end of the variable capacitor VC20 is connected to the second terminal P02.

The acoustic wave resonant circuit 21 includes a parallel circuit of an acoustic wave resonator 211 and an acoustic wave resonator 212. The resonant frequency of the acoustic wave resonator 211 differs from the resonant frequency of the acoustic wave resonator 212, and the anti-resonant frequency of the acoustic wave resonator 211 differs from the anti-resonant frequency of the acoustic wave resonator 212.

The acoustic wave resonant circuit 22 includes a parallel circuit of an acoustic wave resonator 221 and an acoustic wave resonator 222. The resonant frequency of the acoustic wave resonator 221 differs from the resonant frequency of the acoustic wave resonator 222, and the anti-resonant frequency of the acoustic wave resonator 221 differs from the anti-resonant frequency of the acoustic wave resonator 222.

The acoustic wave resonant circuit 23 includes a parallel circuit of an acoustic wave resonator 231 and an acoustic wave resonator 232. The resonant frequency of the acoustic wave resonator 231 differs from the resonant frequency of the acoustic wave resonator 232, and the anti-resonant frequency of the acoustic wave resonator 231 differs from the anti-resonant frequency of the acoustic wave resonator 232.

The switching circuit SW1 includes a common terminal and three terminals to be selected (to be referred to as selective terminals hereinafter). The common terminal is connected to one end of the variable capacitor VC20. A first selective terminal is connected to one end of the acoustic wave resonant circuit 21, a second selective terminal is connected to one end of the acoustic wave resonant circuit 22, and a third selective terminal is connected to one end of the acoustic wave resonant circuit 23.

The switching circuit SW2 includes a common terminal, and three selective terminals. The common terminal is connected to the other end of the variable capacitor VC20. A first selective terminal is connected to the other end of the acoustic wave resonant circuit 21, a second selective terminal is connected to the other end of the acoustic wave resonant circuit 22, and a third selective terminal is connected to the other end of the acoustic wave resonant circuit 23.

The parallel-arm resonant circuit 30 includes acoustic wave resonant circuits 31, 32, and 33, a variable capacitor VC30, and switching circuits SW2 and SW3. The switching circuit SW2 is shared with the series-arm resonant circuit 20. The acoustic wave resonant circuits 31, 32, and 33, each corresponds to "first acoustic wave resonant circuit" and "second acoustic wave resonant circuit" according to the present disclosure.

The acoustic wave resonant circuit 31 includes a parallel circuit of an acoustic wave resonator 311 and an acoustic wave resonator 312. The resonant frequency of the acoustic wave resonator 311 differs from the resonant frequency of the acoustic wave resonator 312, and the anti-resonant frequency of the acoustic wave resonator 311 differs from the anti-resonant frequency of the acoustic wave resonator 312.

The acoustic wave resonant circuit 32 includes a parallel circuit of an acoustic wave resonator 321 and an acoustic wave resonator 322. The resonant frequency of the acoustic wave resonator 321 differs from the resonant frequency of the acoustic wave resonator 322, and the anti-resonant frequency of the acoustic wave resonator 321 differs from the anti-resonant frequency of the acoustic wave resonator 322.

The acoustic wave resonant circuit 33 includes a parallel circuit of an acoustic wave resonator 331 and an acoustic wave resonator 332. The resonant frequency of the acoustic wave resonator 331 differs from the resonant frequency of the acoustic wave resonator 332, and the anti-resonant frequency of the acoustic wave resonator 331 differs from the anti-resonant frequency of the acoustic wave resonator 332.

The switching circuit SW2 includes a common terminal, and three selective terminals. The common terminal is connected to the other end of the variable capacitor VC20. A first selective terminal is connected to one end of the acoustic wave resonant circuit 31, a second selective terminal is connected to one end of the acoustic wave resonant circuit 32, and a third selective terminal is connected to one end of the acoustic wave resonant circuit 33.

The switching circuit SW3 includes a common terminal, and three selective terminals. The common terminal is connected to one end of the variable capacitor VC30. A first selective terminal is connected to the other end of the acoustic wave resonant circuit 31, a second selective terminal is connected to the other end of the acoustic wave resonant circuit 32, and a third selective terminal is connected to the other end of the acoustic wave resonant circuit 33.

One end of the variable capacitor VC30 is connected to the common terminal of the switching circuit SW3 as described above. The other end of the variable capacitor VC30 is connected to the ground potential.

Figure 2A:
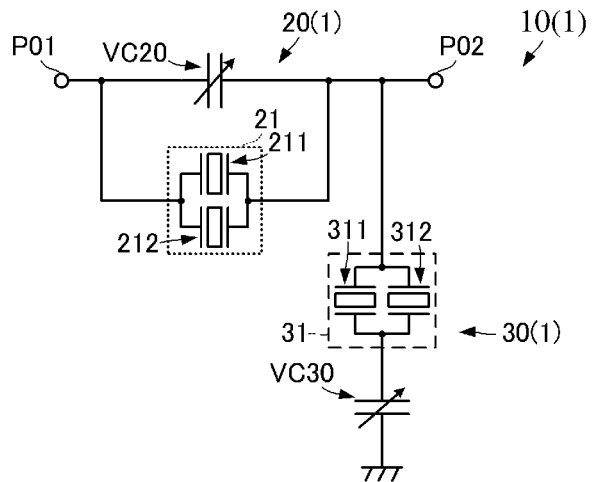
FIGS. 2A-2C are circuit diagrams illustrating each different connection mode of switching circuits of the tunable filter according to the first embodiment of the present disclosure.
Figure 2B:
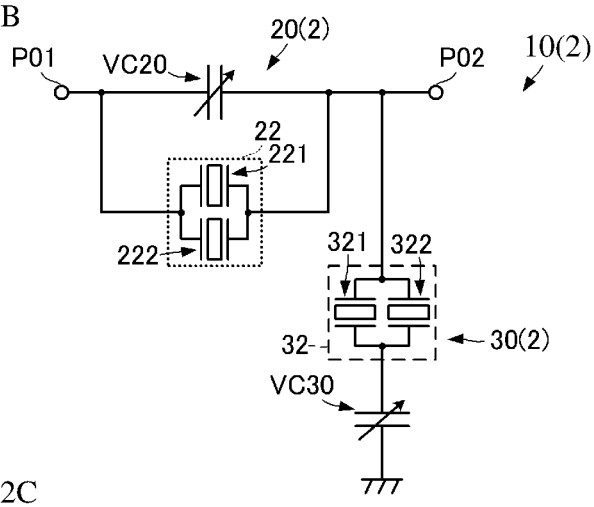
Figure 2C:
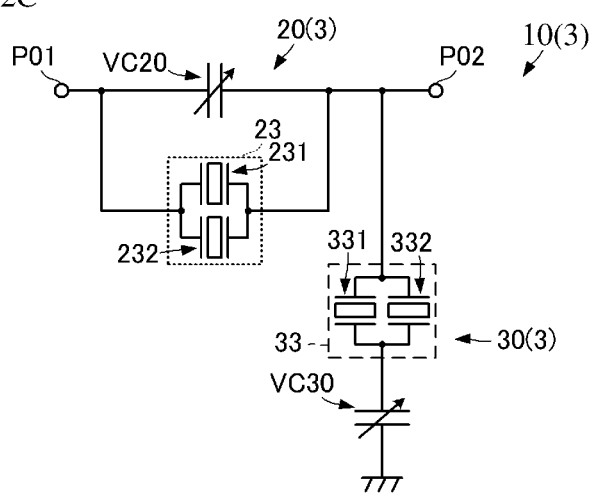

The switching circuits SW1, SW2, and SW3 are operatively coupled to each other to coordinate. The three kinds of circuits illustrated in FIG. 2A to FIG. 2C are provided by the switching action of the switching circuits SW1, SW2, and SW3. FIGS. 2A-2C are circuit diagrams illustrating each different connection mode of the switching circuits of the tunable filter according to the first embodiment of the present disclosure. FIG. 2A illustrates a connection mode in which the acoustic wave resonant circuits 21 and 31 are selected. FIG. 2B illustrates a connection mode in which the acoustic wave resonant circuits 22 and 32 are selected. FIG. 2C illustrates a connection mode in which the acoustic wave resonant circuits 23 and 33 are selected.

In the mode illustrated in FIG. 2A, a tunable filter 10(1) includes a series-arm resonant circuit 20(1), which is formed by a parallel circuit of the acoustic wave resonant circuit 21 and the variable capacitor VC20, and a parallel-arm resonant circuit 30(1), which is formed by a series circuit of the acoustic wave resonant circuit 31 and the variable capacitor VC30. In the mode illustrated in FIG. 2B, a tunable filter 10(2) includes a series-arm resonant circuit 20(2), which is formed by a parallel circuit of the acoustic wave resonant circuit 22 and the variable capacitor VC20, and a parallel-arm resonant circuit 30(2), which is formed by a series circuit of the acoustic wave resonant circuit 32 and the variable capacitor VC30. In the mode illustrated in FIG. 2C, a tunable filter 10(3) includes a series-arm resonant circuit 20(3), which is formed by a parallel circuit of the acoustic wave resonant circuit 23 and the variable capacitor VC20, and a parallel-arm resonant circuit 30(3), which is formed by a series circuit of the acoustic wave resonant circuit 33 and the variable capacitor VC30.

The pass band created by the resonant/anti-resonant characteristics of the acoustic wave resonant circuits 21 and 31, the pass band created by the resonant/anti-resonant characteristics of the acoustic wave resonant circuits 22 and 32, and the pass band created by the resonant/anti-resonant characteristics of the acoustic wave resonant circuits 23 and 33 are different along the frequency axis. When it is stated in the description that two pass bands are different, this may mean that the two pass bands are either partially overlapping or spaced apart from each other. It is preferable, however, that the two pass bands be spaced apart from each other.

The difference in frequency between these pass bands is set greater than the difference in pass-band frequency that may be changed by changing the range of values that may be taken by the capacitance of each of the variable capacitors VC20 and VC30. In this regard, the difference in frequency between pass bands refers to the difference between the center frequencies of the pass bands.

This configuration helps increase the variable range of the pass-band center frequency of the tunable filter 10, thus allowing the filter to be adapted to many different communication bands. Further, the tunable filter 10 is able to achieve the filter characteristics illustrated in FIG. 3.

The tunable filter 10 is configured such that if the frequency range to be tuned is equal to or less than the maximum difference in pass-band frequency that may be provided by the variable range of capacitance of the variable capacitor, the variable range of capacitance of the variable capacitor is adjusted, and if the frequency range to be tuned is greater the maximum difference in pass-band frequency that may be provided by the variable range of capacitance of the variable capacitor, the switching circuits are switched.

Figure 3:
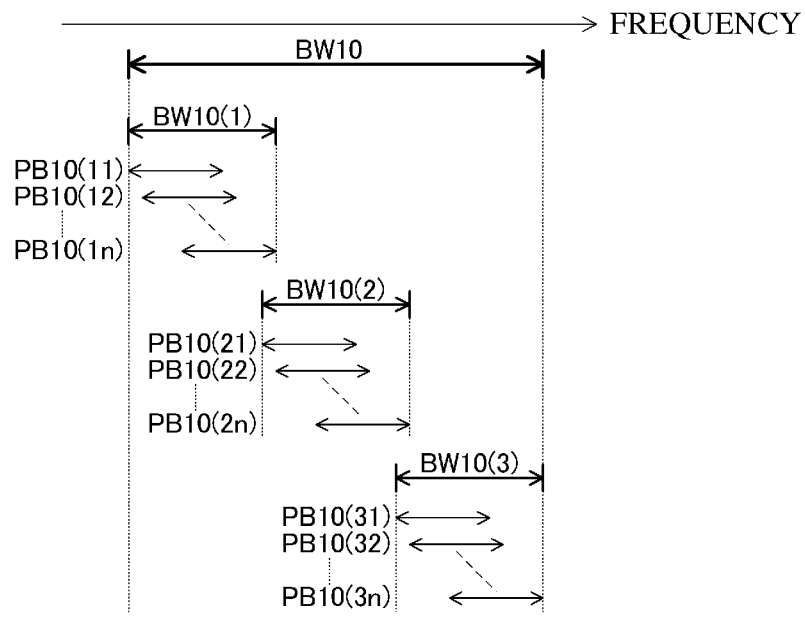
FIG. 3 is a conceptual diagram illustrating the frequency distribution of pass bands provided by the tunable filter according to the first embodiment of the present disclosure.

FIG. 3 is a conceptual diagram illustrating the frequency distribution of pass bands provided by the tunable filter according to the first embodiment of the present disclosure.

In FIG. 3, BW10 represents the frequency range of the pass band that may be provided by the tunable filter 10. BW10(1) represents the frequency range of the pass band that may be provided by the tunable filter 10(1) according to a first connection mode of the switching circuits. BW10(2) represents the frequency range of the pass band that may be provided by the tunable filter 10(2) according to a second connection mode of the switching circuits. BW10(3) represents the frequency range of the pass band that may be provided by the tunable filter 10(3) according to a third connection mode of the switching circuits.

In FIG. 3, PB10(11), PB10(12), ..., PB10(1n) represent pass bands that may be created by using the acoustic wave resonant circuits 21 and 31 (the first connection mode of the switching circuits) and adjusting the capacitance of each of the variable capacitors VC20 and VC30. PB10(21), PB10(22), ..., PB10(2n) represent pass bands that may be created by using the acoustic wave resonant circuits 22 and 32 (the second connection mode of the switching circuits) and adjusting the capacitance of each of the variable capacitors VC20 and VC30. PB10(31), PB10(32), ..., PB10(3n) represent pass bands that may be created by using the acoustic wave resonant circuits 23 and 33 (the third connection mode of the switching circuits) and adjusting the capacitance of each of the variable capacitors VC20 and VC30.

As illustrated in FIG. 3, different pass bands may be obtained by adjusting the capacitance of each of the variable capacitors VC20 and VC30 for each different connection mode of the switching circuits. Specifically, for the first connection mode of the switching circuits, a plurality of pass bands PB10(11), PB10(12), ..., PB10(1n) may be obtained by selecting the acoustic wave resonant circuits 21 and 31, and adjusting the capacitance of each of the variable capacitors VC20 and VC30. Consequently, for the first connection mode of the switching circuits, the pass band BW10(1) that is broader than each of the pass bands PB10(11), PB10(12), ..., PB10(1n) may be obtained.

Likewise, for the second connection mode of the switching circuits, the pass band BW10(2) that is broader than each of the pass bands PB10(21), PB10(22), ..., PB10(2n) may be obtained. For the third connection mode of the switching circuits, the pass band BW10(3) that is broader than each of the pass bands PB10(31), PB10(32), ..., PB10(3n) may be obtained.

Further, for the tunable filter 10, the resonant and anti-resonant frequencies of a plurality of acoustic wave resonant circuits constituting each of the series-arm resonant circuit 20 and the parallel-arm resonant circuit 30 are determined so as to provide different pass bands for different connection modes of the switching circuits. Accordingly, as illustrated in FIG. 3, the frequency range BW10(1) of the pass band provided by the tunable filter 10(1), the frequency range BW10(2) of the pass band provided by the tunable filter 10(2), and the frequency range BW10(3) of the pass band provided by the tunable filter 10(3) differ from each other. Consequently, the frequency range BW10 of the pass band that may be provided by the tunable filter 10 as a whole is greater than each of the ranges of possible frequencies BW10(1), BW10(2), and BW10(3) that may be taken by these pass bands.

As described above, the pass band of the tunable filter 10 is tunable over a broader frequency range than would be possible by simply adjusting the capacitance of the variable capacitor. Although relying solely on the switching action of the switching circuits may reduce the fineness with which the pass band is adjusted, the first embodiment also utilizes adjustment of the variable capacitor in adjusting the pass band. Therefore, the tunable range of center frequency may be extended without necessarily increasing the tuning pitch of the pass-band center frequency of the tunable filter 10. This ensures adaptability to communication bands that are adjacent to each other in frequency. Each switching circuit may include four or more selective terminals.

In the tunable filter 10, the series-arm resonant circuit 20 and the parallel-arm resonant circuit 30 share the same switching circuit SW20. This helps simplify the circuit configuration of the tunable filter 10, thus enabling miniaturization.

Figure 4:
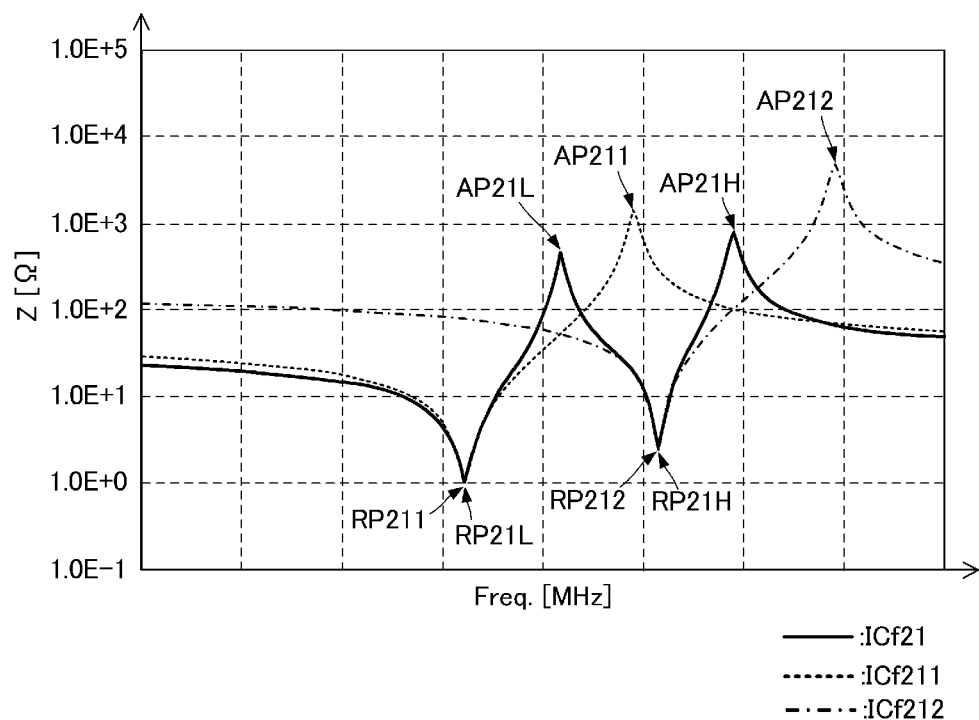
FIG. 4 illustrates the impedance characteristics of an acoustic wave resonant circuit and associated acoustic wave resonators according to the first embodiment of the present disclosure.

Next, a specific method for setting the impedance and filter characteristics (bandpass characteristics and attenuation characteristics) of each acoustic wave resonant circuit and each acoustic wave resonator will be described. FIG. 4 illustrates the impedance characteristics of an acoustic wave resonant circuit and associated acoustic wave resonators according to the first embodiment of the present disclosure. Individual acoustic wave resonant circuits constituting the tunable filter 10 according to the first embodiment, and their associated acoustic wave resonators differ only in resonant frequency and anti-resonant frequency, and are conceptually identical in terms of how their impedance characteristics are set. Accordingly, the following description will be directed only to the acoustic wave resonant circuit 21.

As illustrated in FIG. 4, the frequency of a resonant point RP211 of the acoustic wave resonator 211 is lower than the frequency of a resonant point RP212 of the acoustic wave resonator 212. The frequency of an anti-resonant point AP211 of the acoustic wave resonator 211 is lower than the frequency of an anti-resonant point AP212 of the acoustic wave resonator 212.

The acoustic wave resonant circuit 21 exhibits impedance characteristics that are a composite of the impedance characteristics of the acoustic wave resonator 211 and the impedance characteristics of the acoustic wave resonator 212. This means that the acoustic wave resonant circuit 21, which is formed by a parallel connection of the acoustic wave resonators 211 and 212, has a first resonant point RP21L and a second resonant point RP21H. The frequency of the first resonant point RP21L is lower than the frequency of the second resonant point RP21H. The frequency of the first resonant point RP21L coincides with the frequency of the resonant point RP211 of the acoustic wave resonator 211. The frequency of the second resonant point RP21H coincides with the frequency of the resonant point RP212 of the acoustic wave resonator 212.

The acoustic wave resonant circuit 21 has a first anti-resonant point AP21L and a second anti-resonant point AP21H. The frequency of the first anti-resonant point AP21L is lower than the frequency of the second anti-resonant point AP21H. The frequency of the first anti-resonant point AP21L lies between the frequency of the first resonant point RP21L and the frequency of the second resonant point RP21H. The frequency of the second anti-resonant point AP21H is higher than the frequency of the second resonant point RP21H. As described above, two resonant points that differ in frequency, and two anti-resonant points that differ in frequency appear in the acoustic wave resonant circuit 21.

Figure 5:
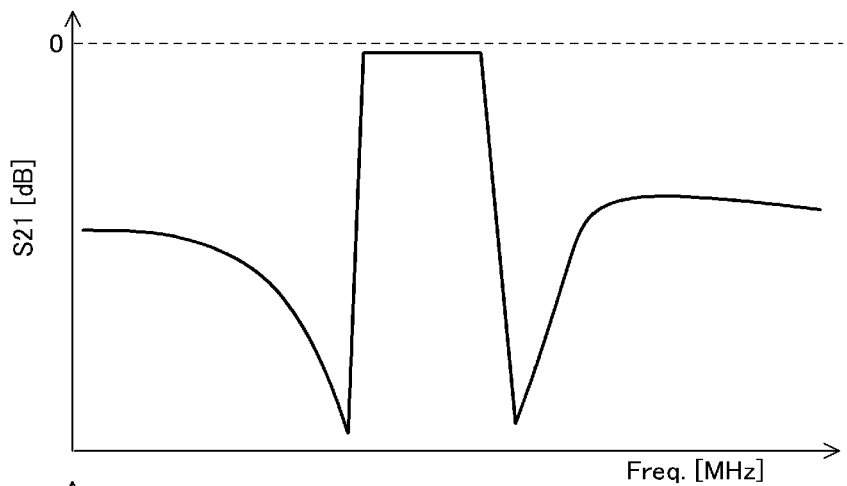
FIG. 5 illustrates the relationship between the bandpass characteristics and impedance characteristics of one implementation of the tunable filter according to the first embodiment of the present disclosure.
Figure 5:
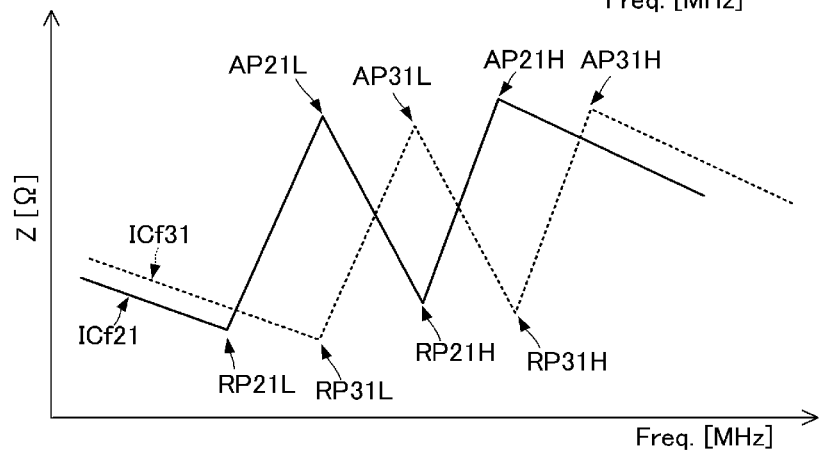

The presence of the acoustic wave resonant circuit 21 having the above-mentioned impedance characteristics in the series-arm resonant circuit, and the presence of the acoustic wave resonant circuit 31 having similar impedance characteristics in the parallel-arm resonant circuit results in the filter characteristics as illustrated in FIG. 5. FIG. 5 illustrates the relationship between the bandpass characteristics and impedance characteristics of one implementation of the tunable filter according to the first embodiment of the present disclosure. The upper part of FIG. 5 depicts the bandpass characteristics, and the lower part of FIG. 5 depicts the impedance characteristics.

As illustrated in the lower part of FIG. 5, the acoustic wave resonant circuit 21 in the series arm, and the acoustic wave resonant circuit 31 in the parallel arm are set to differ in the frequency of the resonant point and in the frequency of the anti-resonant point.

The second resonant point (the resonant point on the higher frequency side) RP21H of the acoustic wave resonant circuit 21 in the series arm, and a first anti-resonant point (the anti-resonant point on the lower frequency side) AP31L of the acoustic wave resonant circuit 31 in the parallel arm are set at substantially the same frequency. This results in the pass band of the tunable filter as illustrated in the upper part of FIG. 5.

The second anti-resonant point (the anti-resonant point on the higher frequency side) AP21H of the acoustic wave resonant circuit 21 in the series arm, and a second resonant point (the resonant point on the higher frequency side) RP31H of the acoustic wave resonant circuit 31 in the parallel arm are set at substantially the same frequency or at proximate frequencies. As a result, as illustrated in the upper part of FIG. 5, an attenuation pole is created at the higher frequency side of the pass band of the tunable filter, resulting in steep attenuation characteristics at the higher frequency side of the pass band.

The first anti-resonant point (the anti-resonant point on the lower frequency side) AP21L of the acoustic wave resonant circuit 21 in the series arm, and a first resonant point (the resonant point on the lower frequency side) RP31L of the acoustic wave resonant circuit 31 in the parallel arm are set at substantially the same frequency or at proximate frequencies. As a result, as illustrated in the upper part of FIG. 5, an attenuation pole is created at the lower frequency side of the pass band of the tunable filter, resulting in steep attenuation characteristics at the lower frequency side of the pass band.

Such resonant points and anti-resonant points are set for each combination of an acoustic wave resonant circuit in the series arm and an acoustic wave resonant circuit in the parallel arm, and the respective pass bands of the tunable filter are set in different frequency ranges.

By adjusting the capacitance of the variable capacitor VC20, the frequency of the anti-resonant point of the acoustic wave resonant circuit in the series arm may be changed while hardly changing the frequency of the resonant point. Further, by adjusting the capacitance of the variable capacitor VC30, the frequency of the resonant point of the acoustic wave resonant circuit in the parallel arm may be changed while hardly changing the frequency of the anti-resonant point. This makes it possible to change the frequency of the attenuation pole at the higher frequency side of the pass band and the frequency of the attenuation pole at the lower frequency side of the pass band, thus allowing the pass-band frequency to be changed without necessarily hardly any changes in insertion loss in the pass band. At this time, adjusting both the capacitance of the variable capacitor VC20 and the capacitance of the variable capacitor VC30 makes it possible to achieve more diverse bandpass characteristics than would be achieved by adjusting only one of the capacitance of the variable capacitor VC20 and the capacitance of the variable capacitor VC30.

Figure 6:
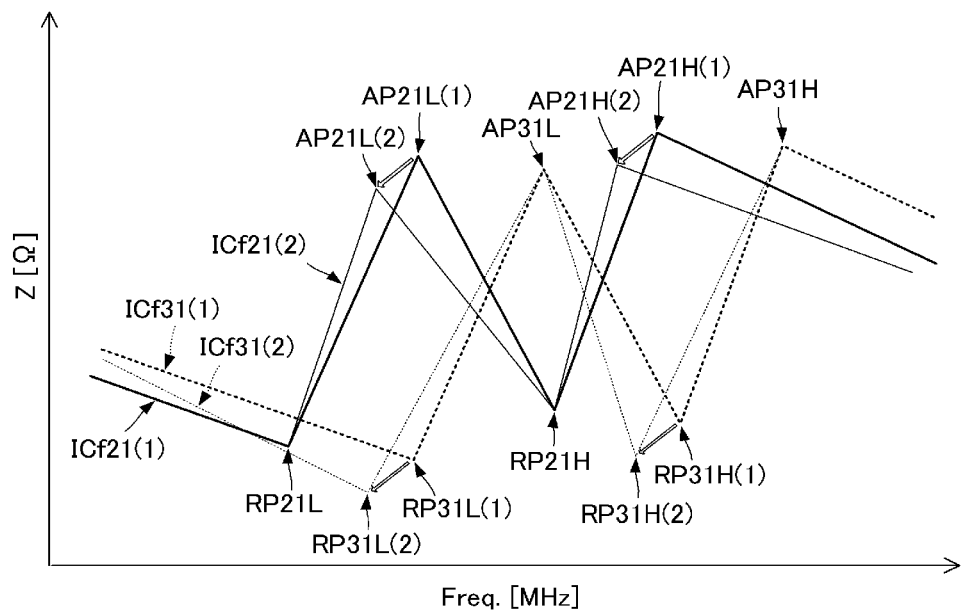
FIG. 6 illustrates how the presence of a plurality of acoustic wave resonators affects impedance characteristics.

Further, the tunable filter 10 has the following features due to the formation of each acoustic wave resonant circuit by a parallel connection of a plurality of acoustic wave resonators. FIG. 6 illustrates how the presence of a plurality of acoustic wave resonators affects impedance characteristics.

Adjusting the capacitance of the variable capacitor VC20 causes the first anti-resonant point AP21L and the second anti-resonant point AP21H to change in frequency and impedance.

Specifically, as illustrated in FIG. 6, the frequency at a first anti-resonant point AP21L(2) when the variable capacitor VC20 in the series arm has a large capacitance is lower than the frequency at a first anti-resonant point AP21L(1) when the variable capacitor VC20 has a small capacitance. At this time, the impedance at the first anti-resonant point AP21L(2) when the variable capacitor VC20 has a large capacitance becomes lower than the impedance at the first anti-resonant point AP21L(1) when the variable capacitor VC20 has a small capacitance.

In this case, the capacitance of the variable capacitor VC30 in the parallel arm is adjusted to increase in the same manner as the variable capacitor VC20. As a result, the frequency at a first resonant point RP31L(2) when the variable capacitor VC30 in the parallel arm has a large capacitance becomes lower than the frequency at a first resonant point RP31L(1) when the variable capacitor VC30 has a small capacitance. That is, substantially the same frequency shift as that for the first anti-resonant point AP21L in the series arm may be obtained. Further, at this time, the impedance at the first resonant point RP31L(2) when the variable capacitor VC30 has a large capacitance may be made lower than the impedance at the first resonant point RP31L(1) when the variable capacitor VC30 has a small capacitance.

As a result, for cases where the capacitance of each of the variable capacitors VC20 and VC30 is changed from a small value to a large value, a decrease in the amount of attenuation at the attenuation pole due to a decrease in impedance at the first anti-resonant point AP21L may be minimized by a decrease in impedance at the first resonant point RP31L.

Conversely, for cases where the capacitance of each of the variable capacitors VC20 and VC30 is changed from a large value to a small value, a decrease in the amount of attenuation at the attenuation pole due to an increase in impedance at the first resonant point RP31L may be minimized by an increase in impedance at the first anti-resonant point AP21L.

As a result, the amount of attenuation and steepness of attenuation characteristics of the attenuation pole at the lower frequency side of the pass band may be maintained substantially the same even when the variable capacitors VC20 and VC30 are varied in capacitance.

Likewise, the frequency at a second anti-resonant point AP21H(2) when the variable capacitor VC20 in the series arm has a large capacitance is lower than the frequency at a second anti-resonant point AP21H(1) when the variable capacitor VC20 has a small capacitance. At this time, the impedance at the second anti-resonant point AP21H(2) when the variable capacitor VC20 has a large capacitance becomes lower than the impedance at the second anti-resonant point AP21H(1) when the variable capacitor VC20 has a small capacitance.

In this case, the capacitance of the variable capacitor VC30 in the parallel arm is adjusted to increase in the same manner as the variable capacitor VC20. As a result, the frequency at a second resonant point RP31H(2) when the variable capacitor VC30 in the parallel arm has a large capacitance becomes lower than the frequency at a second resonant point RP31H(1) when the variable capacitor VC30 has a small capacitance. That is, substantially the same frequency shift as that for the second anti-resonant point AP21H in the parallel arm may be provided. Further, at this time, the impedance at the second resonant point RP31H(2) when the variable capacitor VC30 has a large capacitance may be made lower than the impedance at the second resonant point RP31H(1) when the variable capacitor VC30 has a small capacitance.

As a result, for cases where the capacitance of each of the variable capacitors VC20 and VC30 is changed from a small value to a large value, a decrease in the amount of attenuation at the attenuation pole due to a decrease in impedance at the second anti-resonant point AP21H may be minimized by a decrease in impedance at the second resonant point RP31H.

Conversely, for cases where the capacitance of each of the variable capacitors VC20 and VC30 is changed from a large value to a small value, a decrease in the amount of attenuation at the attenuation pole due to an increase in impedance at the second resonant point RP31H may be minimized by an increase in impedance at the second anti-resonant point AP21H.

As a result, the amount of attenuation and steepness of attenuation characteristics of the attenuation pole at the higher frequency side of the pass band may be maintained substantially the same even when the variable capacitors VC20 and VC30 are varied in capacitance.

As described above, acoustic wave resonant circuits, each including a parallel connection of acoustic wave resonators with mutually different frequency characteristics are used. This configuration makes it possible to provide the tunable filter 10 with which varying the capacitance of each of the variable capacitors VC20 and VC30 only results in a shift in frequency range, with no deterioration in bandpass and attenuation characteristics. Although the foregoing description of the first embodiment is directed to a case where a parallel circuit of acoustic wave resonators is used for both the acoustic wave resonant circuit in the series arm and the acoustic wave resonant circuit in the parallel arm, a parallel circuit of acoustic wave resonators may be included in one of the acoustic wave resonant circuit in the series arm and the acoustic wave resonant circuit in the parallel arm.

Figure 7:
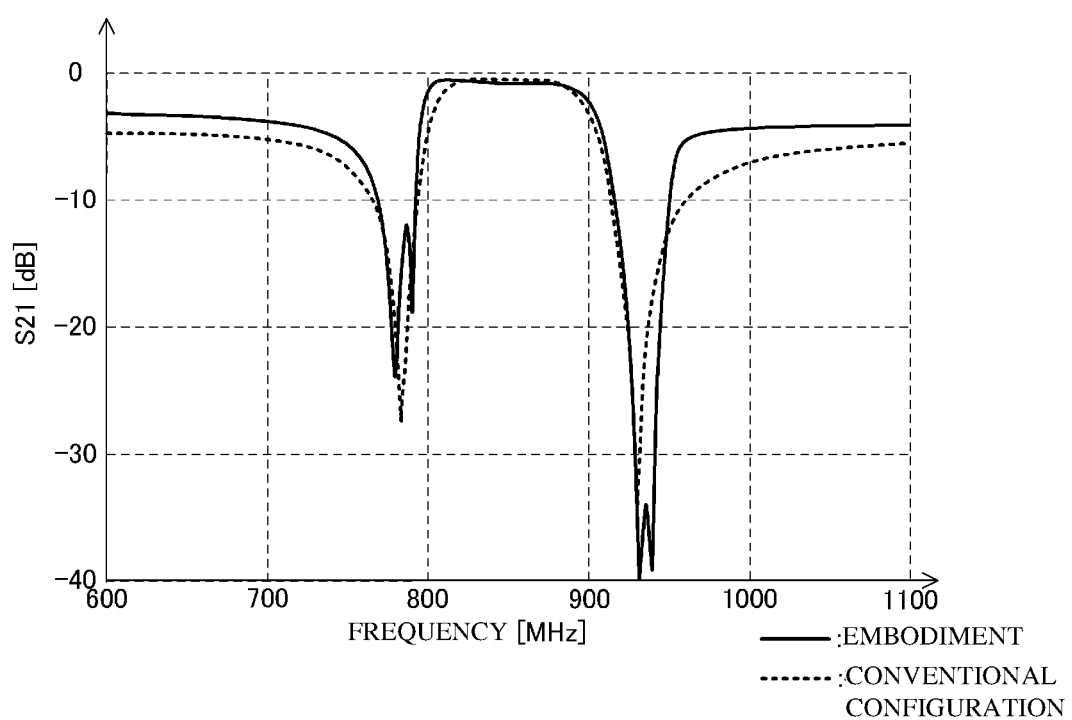
FIG. 7 illustrates the bandpass characteristics of the tunable filter according to the first embodiment of the present disclosure, and the bandpass characteristics of a tunable filter according to a conventional configuration.

Further, the bandpass characteristics illustrated in FIG. 7 may be obtained with the tunable filter 10 including a parallel circuit of acoustic wave resonators. FIG. 7 illustrates the bandpass characteristics of the tunable filter according to the first embodiment of the present disclosure, and the bandpass characteristics of a tunable filter according to a conventional configuration. A conventional configuration refers to a configuration such that, as previously described with reference to related art, one acoustic wave resonator and one variable capacitor are disposed in each arm. The respective bandpass characteristics of the two filters are compared under the assumption that the number of stages in the ladder network is the same between the two filters.

As illustrated in FIG. 7, the tunable filter 10 may be provided with two attenuation poles near the higher and lower frequency sides of the pass band. This helps increase the amount of attenuation and the steepness of attenuation characteristics. Further, there is hardly any deterioration of insertion loss in the pass band in comparison to the conventional configuration.

As described above, the tunable filter 10 according to the first embodiment makes it possible to reduce deterioration of insertion loss in substantially all of the pass bands to be selected, and achieving steep attenuation characteristics. This makes it possible to provide a tunable filter with which, even if the tunable range of the pass-band center frequency of the tunable filter is extended, communication signals in a desired communication band within this pass band are allowed to pass with low insertion loss, and unwanted wave signals including communication signals in a communication band adjacent to the desired communication band are greatly attenuated.

Figure 8:
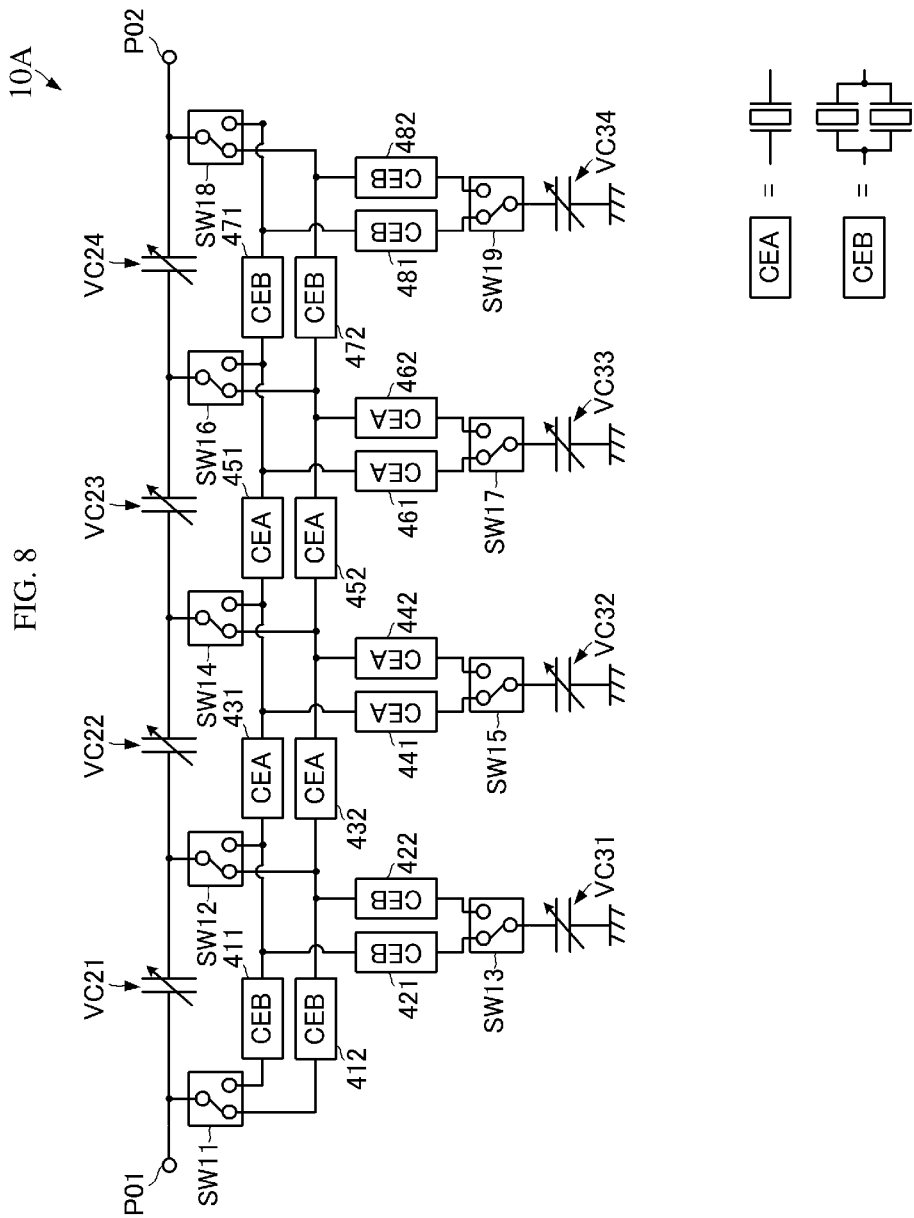
FIG. 8 is a circuit diagram of a tunable filter according to a second embodiment of the present disclosure.

Next, a tunable filter according to a second embodiment will be described with reference to the drawings. FIG. 8 is a circuit diagram of the tunable filter according to the second embodiment of the present disclosure.

A tunable filter 10A according to the second embodiment of the present disclosure differs from the tunable filter 10 according to the first embodiment in the number of stages in each of series-arm and parallel-arm resonant circuits, the number of acoustic wave resonant circuits to be selected, and the number of acoustic wave resonators constituting each acoustic wave resonant circuit. The basic operation of the tunable filter 10A, such as the switching operation, is the same as that of the tunable filter 10 according to the first embodiment and thus will not be described in further detail.

The tunable filter 10A includes acoustic wave resonant circuits 411, 412, 421, 422, 431, 432, 441, 442, 451, 452, 461, 462, 471, 472, 481, and 482, variable capacitors VC21, VC22, VC23, VC24, VC31, VC32, VC33, and VC34, and switching circuits SW11, SW12, SW13, SW14, SW15, SW16, SW17, and SW18.

The variable capacitors VC21, VC22, VC23, and VC24 are connected in series between the first terminal P01 and the second terminal P02.

The acoustic wave resonant circuits 411 and 412 are selectively connected in parallel to the variable capacitor VC21 by the switching circuits SW11 and SW12. This configuration provides a first series-arm resonant circuit.

The acoustic wave resonant circuits 421 and 422 are selectively connected at one end to the side of the variable capacitor VC22 adjacent to the variable capacitor VC21 by the switching circuit SW12. In this regard, the acoustic wave resonant circuit 421 is connected to the acoustic wave resonant circuit 411, and the acoustic wave resonant circuit 422 is connected to the acoustic wave resonant circuit 412. The acoustic wave resonant circuits 421 and 422 are selectively connected at the other end to one end of the variable capacitor VC31 by the switching circuit SW13. The variable capacitor VC31 is connected at the other end to the ground potential. The above-mentioned configuration provides a first parallel-arm resonant circuit.

The acoustic wave resonant circuits 431 and 432 are selectively connected in parallel to the variable capacitor VC22 by the switching circuits SW12 and SW14. This configuration provides a second series-arm resonant circuit. The acoustic wave resonant circuit 431 is connected to the acoustic wave resonant circuit 411, and the acoustic wave resonant circuit 432 is connected to the acoustic wave resonant circuit 412.

The acoustic wave resonant circuit 441 is connected to the acoustic wave resonant circuit 431, and the acoustic wave resonant circuit 442 is connected to the acoustic wave resonant circuit 432. The acoustic wave resonant circuits 441 and 442 are selectively connected at one end to the side of the variable capacitor VC22 adjacent to the variable capacitor VC23 by the switching circuit SW14. The acoustic wave resonant circuits 441 and 442 are selectively connected at the other end to one end of the variable capacitor VC32 by the switching circuit SW15. The variable capacitor VC32 is connected at the other end to the ground potential. The above-mentioned configuration provides a second parallel-arm resonant circuit.

The acoustic wave resonant circuits 451 and 452 are selectively connected in parallel to the variable capacitor VC23 by the switching circuits SW14 and SW16. This configuration provides a third series-arm resonant circuit. The acoustic wave resonant circuit 451 is connected to the acoustic wave resonant circuit 431, and the acoustic wave resonant circuit 452 is connected to the acoustic wave resonant circuit 432.

The acoustic wave resonant circuit 461 is connected to the acoustic wave resonant circuit 451, and the acoustic wave resonant circuit 462 is connected to the acoustic wave resonant circuit 452. The acoustic wave resonant circuits 461 and 462 are selectively connected at one end to the side of the variable capacitor VC23 adjacent to the variable capacitor VC24 by the switching circuit SW16. The acoustic wave resonant circuits 461 and 462 are selectively connected at the other end to one end of the variable capacitor VC33 by the switching circuit SW17. The variable capacitor VC33 is connected at the other end to the ground potential. The above-mentioned configuration provides a third parallel-arm resonant circuit.

The acoustic wave resonant circuits 471 and 472 are selectively connected in parallel to the variable capacitor VC24 by the switching circuits SW16 and SW18. This configuration provides a fourth series-arm resonant circuit. The acoustic wave resonant circuit 471 is connected to the acoustic wave resonant circuit 451, and the acoustic wave resonant circuit 472 is connected to the acoustic wave resonant circuit 452.

The acoustic wave resonant circuit 481 is connected to the acoustic wave resonant circuit 471, and the acoustic wave resonant circuit 482 is connected to the acoustic wave resonant circuit 472. The acoustic wave resonant circuits 481 and 482 are selectively connected at one end to the side of the variable capacitor VC24 adjacent to the second terminal P02 by the switching circuit SW18. The acoustic wave resonant circuits 481 and 482 are selectively connected at the other end to one end of the variable capacitor VC34 by the switching circuit SW19. The variable capacitor VC34 is connected at the other end to the ground potential. The above-mentioned configuration provides a fourth parallel-arm resonant circuit.

Each of the acoustic wave resonant circuits 431, 432, 441, 442, 451, 452, 461, and 462 includes a single acoustic wave resonator. Each of the acoustic wave resonant circuits 411, 412, 421, 422, 471, 472, 481, and 482 includes two acoustic wave resonators that are connected in parallel.

As described above, not all the acoustic wave resonant circuits constituting the tunable filter 10A need to be formed by a parallel connection of two acoustic wave resonators. Such a configuration may also provide the same operational effect as the first embodiment.

Figure 9:
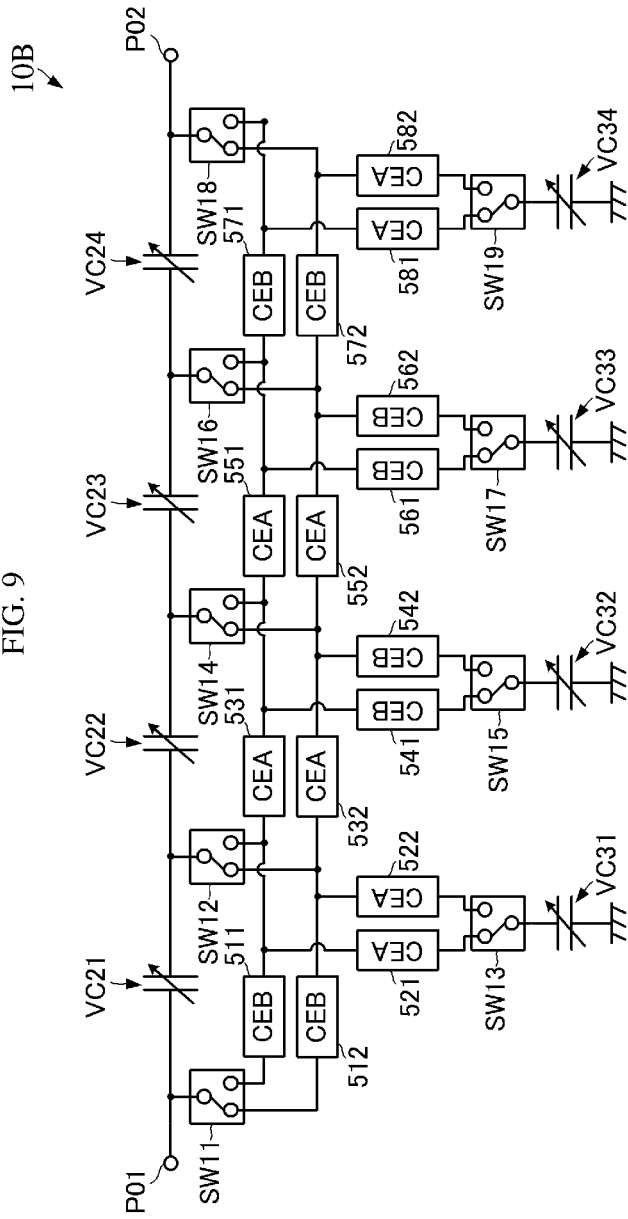
FIG. 9 is a circuit diagram of a tunable filter according to a third embodiment of the present disclosure.
Figure 9:
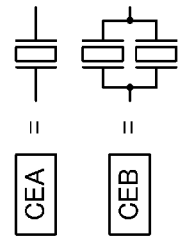

Next, a tunable filter according to a third embodiment of the present disclosure will be described below with reference to the drawings. FIG. 9 is a circuit diagram of the tunable filter according to the third embodiment of the present disclosure.

A tunable filter 10B according to the third embodiment of the present disclosure differs from the tunable filter 10A according to the second embodiment in the circuit configuration of acoustic wave resonant circuits. Otherwise, the configuration of the tunable filter 10B is the same as the tunable filter 10A according to the second embodiment, and thus will not be described in further detail.

A first series-arm resonant circuit includes acoustic wave resonant circuits 511 and 512. A first parallel-arm resonant circuit includes acoustic wave resonant circuits 521 and 522. A second series-arm resonant circuit includes acoustic wave resonant circuits 531 and 532. A second parallel-arm resonant circuit includes acoustic wave resonant circuits 541 and 542. A third series-arm resonant circuit includes acoustic wave resonant circuits 551 and 552. A third parallel-arm resonant circuit includes acoustic wave resonant circuits 561 and 562. A fourth series-arm resonant circuit includes acoustic wave resonant circuits 571 and 572. A fourth parallel-arm resonant circuit includes acoustic wave resonant circuits 581 and 582.

Each of the acoustic wave resonant circuits 521, 522, 531, 532, 551, 552, 581, and 582 includes a single acoustic wave resonator. Each of the acoustic wave resonant circuits 511, 512, 541, 542, 561, 562, 571, and 572 includes two acoustic wave resonators that are connected in parallel.

Even if the number of acoustic wave resonators included in each acoustic wave resonator circuit differs between the series-arm resonant circuit and the parallel-arm resonant circuit that share the same switching circuit as described above, the same effect as those of the above embodiments may be obtained.

Figure 10:
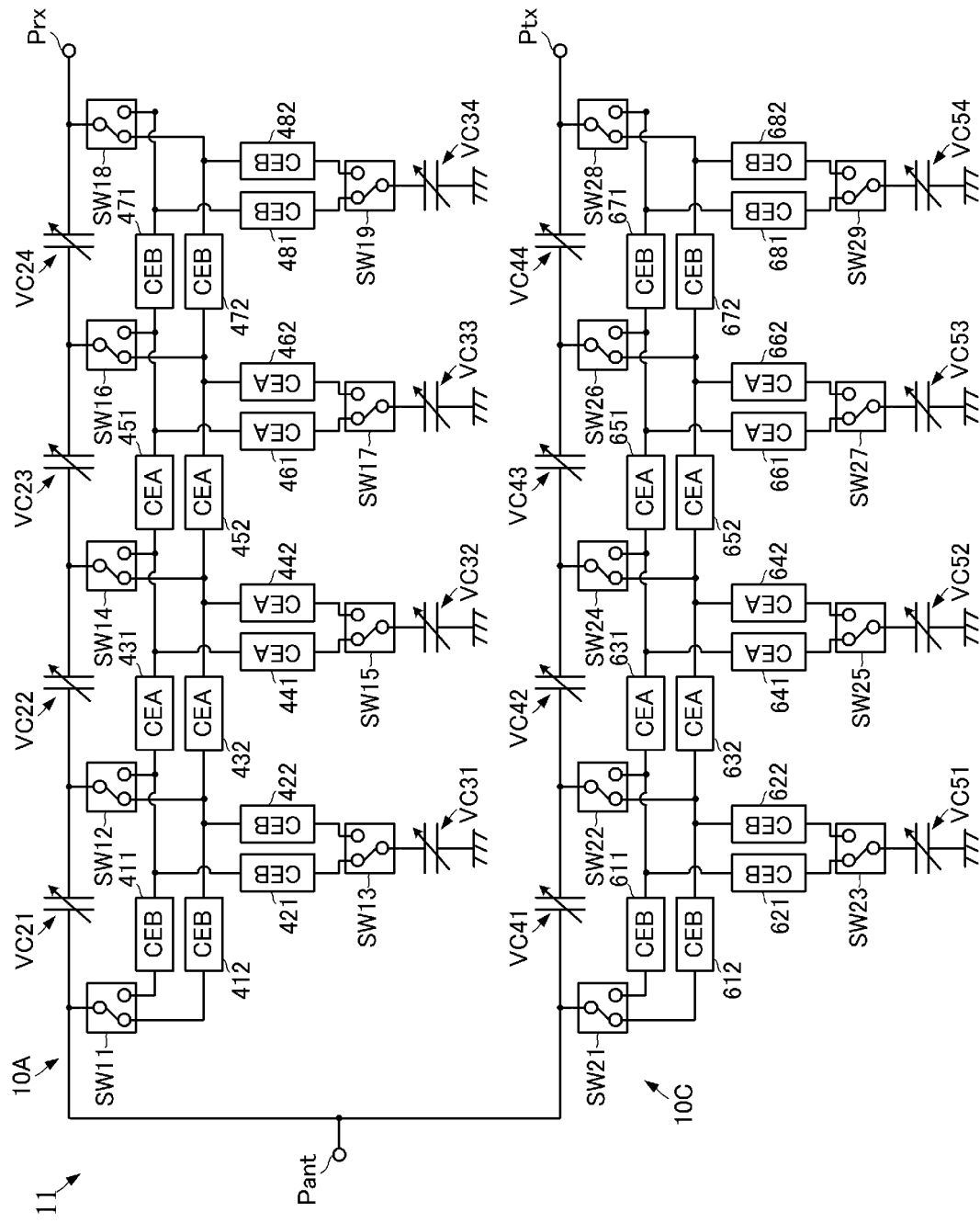
FIG. 10 is a circuit diagram of a tunable branching circuit according to a fourth embodiment of the present disclosure.

Next, a tunable branching circuit according to a fourth embodiment of the present disclosure will be described with reference to the drawings. FIG. 10 is a circuit diagram of the tunable branching circuit according to the fourth embodiment of the present disclosure.

A tunable branching circuit 11 according to the fourth embodiment of the present disclosure includes a transmitting-side filter formed by the tunable filter 10A according to the second embodiment, and a receiving-side filter formed by a tunable filter 10C, which is the same in circuit configuration as the tunable filter 10A and has a pass band different from the pass band of the tunable filter 10A.

One end of the tunable filter 10A is an antenna terminal Pant, and the other end is a receive-signal output terminal Prx. One end of the tunable filter 10C is the antenna terminal Pant, and the other end is a transmit-signal input terminal Ptx. The antenna terminal Pant corresponds to the first terminal P01 according to the second embodiment, and the receive-signal output terminal Prx corresponds to the second terminal P02 according to the second embodiment.

The basic configuration of the tunable filter 10C is the same as that of the tunable filter 10A, and thus will not be described in further detail where appropriate. A first series-arm resonant circuit in the tunable filter 10C includes a variable capacitor VC41, acoustic wave resonant circuits 611 and 612, and switching circuits SW21 and SW22. A first parallel-arm resonant circuit includes a variable capacitor VC51, acoustic wave resonant circuits 621 and 622, and switching circuits SW22 and SW23. A second series-arm resonant circuit includes a variable capacitor VC42, acoustic wave resonant circuits 631 and 632, and switching circuits SW22 and SW24. A second parallel-arm resonant circuit includes a variable capacitor VC52, acoustic wave resonant circuits 641 and 642, and switching circuits SW24 and SW25. A third series-arm resonant circuit includes a variable capacitor VC43, acoustic wave resonant circuits 651 and 652, and switching circuits SW24 and SW26. A third parallel-arm resonant circuit includes a variable capacitor VC53, acoustic wave resonant circuits 661 and 662, and switching circuits SW26 and SW27. A fourth series-arm resonant circuit includes a variable capacitor VC44, acoustic wave resonant circuits 671 and 672, and switching circuits SW26 and SW28. A fourth parallel-arm resonant circuit includes a variable capacitor VC54, acoustic wave resonant circuits 681 and 682, and switching circuits SW28 and SW29.

The above-mentioned configuration makes it possible to provide a tunable branching circuit with which, even if the tunable range of the pass-band center frequency of the tunable filter is extended, communication signals in a desired communication band within this pass band are allowed to pass with low insertion loss, and unwanted wave signals including communication signals in a communication band adjacent to the desired communication band are greatly attenuated.

Figure 11:
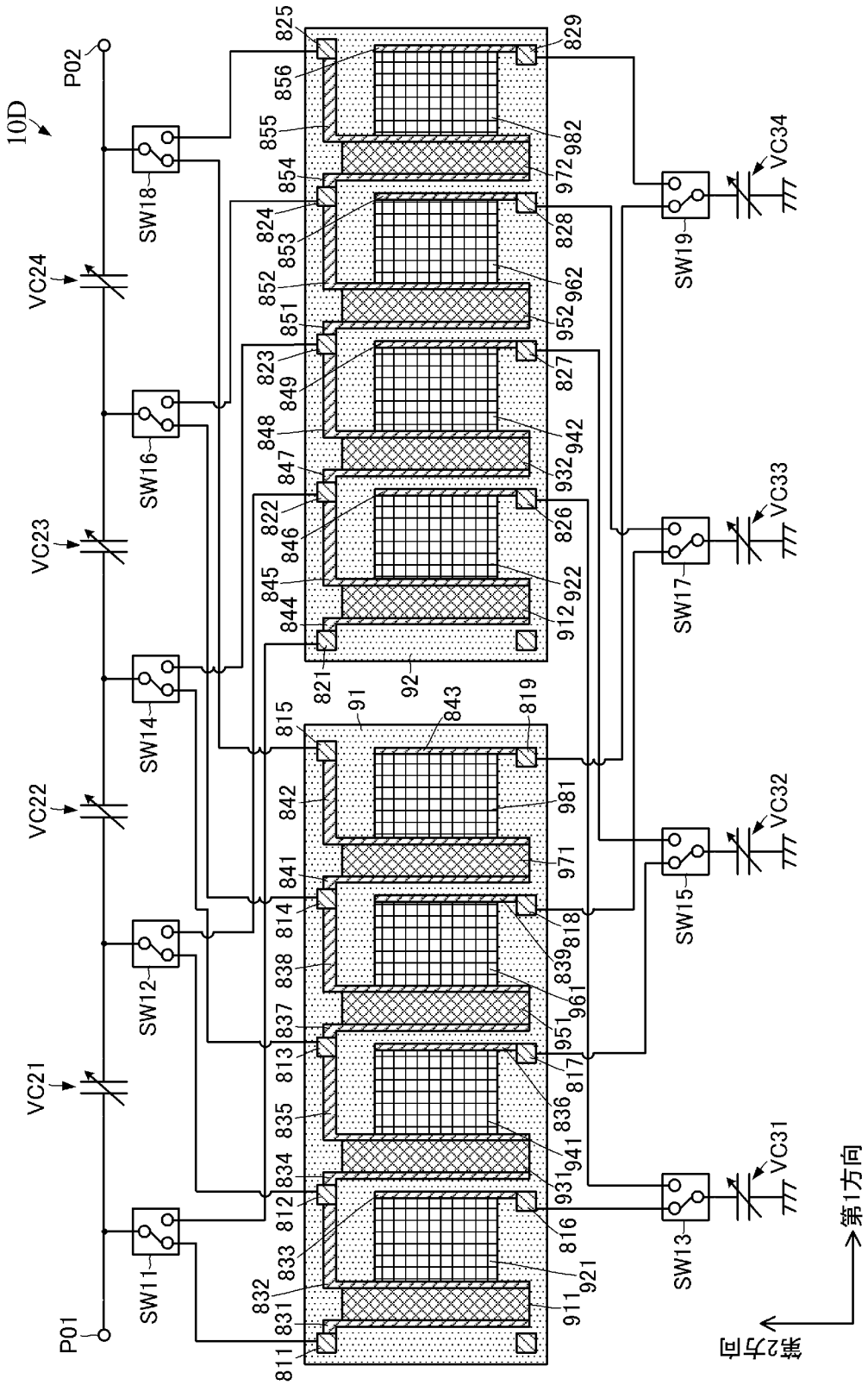
FIG. 11 is a block diagram illustrating the configuration of a tunable filter according to a fifth embodiment of the present disclosure.

Next, a tunable filter according to a fifth embodiment of the present disclosure will be described below with reference to the drawings. FIG. 11 is a block diagram illustrating the configuration of the tunable filter according to the fifth embodiment of the present disclosure.

The circuit configuration of a tunable filter 10D according to the fifth embodiment of the present disclosure is the same as that of the tunable filter 10A according to the second embodiment. The illustrated configuration of the tunable filter 10D depicts, as opposed to that of the tunable filter 10A, the specific structure of the portion of the tunable filter 10D where acoustic wave resonant circuits are formed, and how the acoustic wave resonator circuits are connected to associated switching circuits. Accordingly, such structural portions will be described below, and other portions will not be described.

The tunable filter 10D includes piezoelectrics 91 and 92. The piezoelectrics 91 and 92, which have a rectangular parallelepiped shape, are disposed in the longitudinal direction with their respective longitudinal directions substantially aligned with each other.

The piezoelectric 91 has conductor patterns 911, 931, 951, and 971 used for a series-arm resonant circuit, and conductor patterns 921, 941, 961, and 981 used for a parallel-arm resonant circuit. The conductor patterns 911, 931, 951, and 971 used for a series-arm resonant circuit, and the conductor patterns 921, 941, 961, and 981 used for a parallel-arm resonant circuit are each in the form of an interdigital transducer (IDT).

The conductor patterns 911, 931, 951, and 971 used for a series-arm resonant circuit, and the conductor patterns 921, 941, 961, and 981 used for a parallel-arm resonant circuit are arranged in the longitudinal direction (first direction) of the piezoelectric 91. The conductor patterns used for a series-arm resonant circuit and the conductor patterns used for a parallel-arm resonant circuit are disposed alternately. Specifically, the conductor pattern 911 used for a series-arm resonant circuit, the conductor pattern 921 used for a parallel-arm resonant circuit, the conductor pattern 931 used for a series-arm resonant circuit, the conductor pattern 941 used for a parallel-arm resonant circuit, the conductor pattern 951 used for a series-arm resonant circuit, the conductor pattern 961 used for a parallel-arm resonant circuit, the conductor pattern 971 used for a series-arm resonant circuit, and the conductor pattern 981 used for a parallel-arm resonant circuit are disposed in the stated order.

A wiring conductor pattern 831, which connects to the conductor pattern 911 used for a series-arm resonant circuit, is located on the side of the conductor pattern 911 used for a series-arm resonant circuit opposite to the conductor pattern 921 used for a parallel-arm resonant circuit. A wiring conductor pattern 832, which connects to each of the conductor pattern 911 used for a series-arm resonant circuit and the conductor pattern 921 used for a parallel-arm resonant circuit, is located between the two conductor patterns 911 and 921. A wiring conductor pattern 833, which connects to the conductor pattern 921 used for a parallel-arm resonant circuit, is located on the side of the conductor pattern 921 used for a parallel-arm resonant circuit opposite to the conductor pattern 911 used for a series-arm resonant circuit.

A wiring conductor pattern 834, which connects to the conductor pattern 931 used for a series-arm resonant circuit, is located on the side of the conductor pattern 931 used for a series-arm resonant circuit opposite to the conductor pattern 941 used for a parallel-arm resonant circuit. A wiring conductor pattern 835, which connects to each of the conductor pattern 931 used for a series-arm resonant circuit and the conductor pattern 941 used for a parallel-arm resonant circuit, is located between the two conductor patterns 931 and 941. A wiring conductor pattern 836, which connects to the conductor pattern 941 used for a parallel-arm resonant circuit, is located on the side of the conductor pattern 941 used for a parallel-arm resonant circuit opposite to the conductor pattern 931 used for a series-arm resonant circuit.

A wiring conductor pattern 837, which connects to the conductor pattern 951 used for a series-arm resonant circuit, is located on the side of the conductor pattern 951 used for a series-arm resonant circuit opposite to the conductor pattern 961 used for a parallel-arm resonant circuit. A wiring conductor pattern 838, which connects to each of the conductor pattern 951 used for a series-arm resonant circuit and the conductor pattern 961 used for a parallel-arm resonant circuit, is located between the two conductor patterns 951 and 961. A wiring conductor pattern 839, which connects to the conductor pattern 961 used for a parallel-arm resonant circuit, is located on the side of the conductor pattern 961 used for a parallel-arm resonant circuit opposite to the conductor pattern 951 used for a series-arm resonant circuit.

A wiring conductor pattern 841, which connects to the conductor pattern 971 used for a series-arm resonant circuit, is located on the side of the conductor pattern 971 used for a series-arm resonant circuit opposite to the conductor pattern 981 used for a parallel-arm resonant circuit. A wiring conductor pattern 842, which connects to each of the conductor pattern 971 used for a series-arm resonant circuit and the conductor pattern 981 used for a parallel-arm resonant circuit, is located between the two conductor patterns 971 and 981. A wiring conductor pattern 843, which connects to the conductor pattern 981 used for a parallel-arm resonant circuit, is located on the side of the conductor pattern 981 used for a parallel-arm resonant circuit opposite to the conductor pattern 971 used for a series-arm resonant circuit.

External-connection conductor patterns 811, 812, 813, 814, and 815, which are conductor patterns used for external connection, are rectangular conductor patterns. With respect to the lateral direction (second direction) of the piezoelectric 91, the external-connection conductor patterns 811, 812, 813, 814, and 815 are located closer to one end of the piezoelectric 91 than is the area where the conductor patterns used for a resonant circuit are formed. The external-connection conductor patterns 811, 812, 813, 814, and 815 are disposed in this order in the longitudinal direction of the piezoelectric 91.

The external-connection conductor pattern 811 is disposed in proximity to the conductor pattern 911 used for a series-arm resonant circuit. The external-connection conductor pattern 811 is connected to the wiring conductor pattern 831. The external-connection conductor pattern 812 is disposed in proximity to the conductor pattern 921 used for a parallel-arm resonant circuit and the conductor pattern 931 used for a series-arm resonant circuit. The external-connection conductor pattern 812 is connected to each of the wiring conductor patterns 832 and 834. The external-connection conductor pattern 813 is disposed in proximity to the conductor pattern 941 used for a parallel-arm resonant circuit and the conductor pattern 951 used for a series-arm resonant circuit. The external-connection conductor pattern 813 is connected to each of the wiring conductor patterns 835 and 837. The external-connection conductor pattern 814 is disposed in proximity to the conductor pattern 961 used for a parallel-arm resonant circuit and the conductor pattern 971 used for a series-arm resonant circuit. The external-connection conductor pattern 814 is connected to each of the wiring conductor patterns 838 and 841. The conductor pattern 815 is disposed in proximity to the conductor pattern 981 used for a parallel-arm resonant circuit. The conductor pattern 815 is connected to the wiring conductor pattern 842.

The external-connection conductor patterns 811, 812, 813, 814, and 815 are respectively connected to the switching circuits SW11, SW12, SW14, SW16, and SW18, which are disposed adjacent to one lateral end of the piezoelectric 91.

External-connection conductor patterns 816, 817, 818, and 819 are rectangular conductor patterns. With respect to the lateral direction (second direction) of the piezoelectric 91, the external-connection conductor patterns 816, 817, 818, and 819 are located closer to the other end of the piezoelectric 91 than is the area where the conductor patterns used for a resonant circuit are formed. That is, with respect to the lateral direction of the piezoelectric 91, the external-connection conductor patterns 816, 817, 818, and 819 are located on the side opposite to the external-connection conductor patterns 811, 812, 813, 814, and 815 across the area where the conductor patterns used for a resonant circuit are formed. The external-connection conductor patterns 816, 817, 818, and 819 are disposed in this order in the longitudinal direction of the piezoelectric 91.

The external-connection conductor pattern 816 is disposed in proximity to the conductor pattern 921 used for a parallel-arm resonant circuit. The external-connection conductor pattern 816 is connected to the wiring conductor pattern 833. The external-connection conductor pattern 817 is disposed in proximity to the conductor pattern 941 used for a parallel-arm resonant circuit. The external-connection conductor pattern 817 is connected to the wiring conductor pattern 836. The external-connection conductor pattern 818 is disposed in proximity to the conductor pattern 961 used for a parallel-arm resonant circuit. The external-connection conductor pattern 818 is connected to the wiring conductor pattern 839. The external-connection conductor pattern 819 is disposed in proximity to the conductor pattern 981 used for a parallel-arm resonant circuit. The external-connection conductor pattern 819 is connected to the wiring conductor pattern 843.

The external-connection conductor patterns 816, 817, 818, and 819 are respectively connected to the switching circuits SW13, SW15, SW17, and SW19, which are disposed adjacent to the other lateral end of the piezoelectric 91.

The piezoelectric 92 has conductor patterns 912, 932, 952, and 972 used for a series-arm resonant circuit, and conductor patterns 922, 942, 962, and 982 used for a parallel-arm resonant circuit. The conductor patterns 912, 932, 952, and 972 used for a series-arm resonant circuit, and the conductor patterns 922, 942, 962, and 982 used for a parallel-arm resonant circuit are each in the form of an IDT.

The conductor patterns 912, 932, 952, and 972 used for a series-arm resonant circuit, and the conductor patterns 922, 942, 962, and 982 used for a parallel-arm resonant circuit are arranged in the longitudinal direction of the piezoelectric 92. The conductor patterns used for a series-arm resonant circuit and the conductor patterns used for a parallel-arm resonant circuit are disposed alternately. Specifically, the conductor pattern 912 used for a series-arm resonant circuit, the conductor pattern 922 used for a parallel-arm resonant circuit, the conductor pattern 932 used for a series-arm resonant circuit, the conductor pattern 942 used for a parallel-arm resonant circuit, the conductor pattern 952 used for a series-arm resonant circuit, the conductor pattern 962 used for a parallel-arm resonant circuit, the conductor pattern 972 used for a series-arm resonant circuit, and the conductor pattern 982 used for a parallel-arm resonant circuit are disposed in the stated order.

A wiring conductor pattern 844, which connects to the conductor pattern 912 used for a series-arm resonant circuit, is located on the side of the conductor pattern 912 used for a series-arm resonant circuit opposite to the conductor pattern 922 used for a parallel-arm resonant circuit. A wiring conductor pattern 845, which connects to each of the conductor pattern 912 used for a series-arm resonant circuit and the conductor pattern 922 used for a parallel-arm resonant circuit, is located between the two conductor patterns 912 and 922. A wiring conductor pattern 846, which connects to the conductor pattern 922 used for a parallel-arm resonant circuit, is located on the side of the conductor pattern 922 used for a parallel-arm resonant circuit opposite to the conductor pattern 912 used for a series-arm resonant circuit.

A wiring conductor pattern 847, which connects to the conductor pattern 932 used for a series-arm resonant circuit, is located on the side of the conductor pattern 932 used for a series-arm resonant circuit opposite to the conductor pattern 942 used for a parallel-arm resonant circuit. A wiring conductor pattern 848, which connects to each of the conductor pattern 932 used for a series-arm resonant circuit and the conductor pattern 942 used for a parallel-arm resonant circuit, is located between the two conductor patterns 932 and 942. A wiring conductor pattern 849, which connects to the conductor pattern 942 used for a parallel-arm resonant circuit, is located on the side of the conductor pattern 942 used for a parallel-arm resonant circuit opposite to the conductor pattern 932 used for a series-arm resonant circuit.

A wiring conductor pattern 851, which connects to the conductor pattern 952 used for a series-arm resonant circuit, is located on the side of the conductor pattern 952 used for a series-arm resonant circuit opposite to the conductor pattern 962 used for a parallel-arm resonant circuit. A wiring conductor pattern 852, which connects to each of the conductor pattern 952 used for a series-arm resonant circuit and the conductor pattern 962 used for a parallel-arm resonant circuit, is located between the two conductor patterns 952 and 962. A wiring conductor pattern 853, which connects to the conductor pattern 962 used for a parallel-arm resonant circuit, is located on the side of the conductor pattern 962 used for a parallel-arm resonant circuit opposite to the conductor pattern 952 used for a series-arm resonant circuit.

A wiring conductor pattern 854, which connects to the conductor pattern 972 used for a series-arm resonant circuit, is located on the side of the conductor pattern 972 used for a series-arm resonant circuit opposite to the conductor pattern 982 used for a parallel-arm resonant circuit. A wiring conductor pattern 855, which connects to each of the conductor pattern 972 used for a series-arm resonant circuit and the conductor pattern 982 used for a parallel-arm resonant circuit, is located between the two conductor patterns 972 and 982. A wiring conductor pattern 856, which connects to the conductor pattern 982 used for a parallel-arm resonant circuit, is located on the side of the conductor pattern 982 used for a parallel-arm resonant circuit opposite to the conductor pattern 972 used for a series-arm resonant circuit.

External-connection conductor patterns 821, 822, 823, 824, and 825 are rectangular conductor patterns. With respect to the lateral direction of the piezoelectric 92, the external-connection conductor patterns 821, 822, 823, 824, and 825 are located closer to one end of the piezoelectric 92 than is the area where the conductor patterns used for a resonant circuit are formed. The external-connection conductor patterns 821, 822, 823, 824, and 825 are disposed in this order in the longitudinal direction of the piezoelectric 92.

The external-connection conductor pattern 821 is disposed in proximity to the conductor pattern 912 used for a series-arm resonant circuit. The external-connection conductor pattern 821 is connected to the wiring conductor pattern 844. The external-connection conductor pattern 822 is disposed in proximity to the conductor pattern 922 used for a parallel-arm resonant circuit and the conductor pattern 932 used for a series-arm resonant circuit. The external-connection conductor pattern 822 is connected to each of the wiring conductor patterns 845 and 847. The external-connection conductor pattern 823 is disposed in proximity to the conductor pattern 942 used for a parallel-arm resonant circuit and the conductor pattern 952 used for a series-arm resonant circuit. The external-connection conductor pattern 823 is connected to each of the wiring conductor patterns 848 and 851. The external-connection conductor pattern 824 is disposed in proximity to the conductor pattern 962 used for a parallel-arm resonant circuit and the conductor pattern 972 used for a series-arm resonant circuit. The external-connection conductor pattern 824 is connected to each of the wiring conductor patterns 852 and 854. The external-connection conductor pattern 825 is disposed in proximity to the conductor pattern 982 used for a parallel-arm resonant circuit. The external-connection conductor pattern 825 is connected to the wiring conductor pattern 855.

The external-connection conductor patterns 821, 822, 823, 824, and 825 are respectively connected to the switching circuits SW11, SW12, SW14, SW16, and SW18, which are disposed adjacent to one lateral end of the piezoelectric 92.

External-connection conductor patterns 826, 827, 828, and 829 are rectangular conductor patterns. With respect to the lateral direction of the piezoelectric 92, the external-connection conductor patterns 826, 827, 828, and 829 are located closer to the other end of the piezoelectric 92 than is the area where the conductor patterns used for a resonant circuit are formed. That is, with respect to the lateral direction of the piezoelectric 92, the external-connection conductor patterns 826, 827, 828, and 829 are located on the side opposite to the external-connection conductor patterns 821, 822, 823, 824, and 825 across the area where the conductor patterns used for a resonant circuit are formed. The external-connection conductor patterns 826, 827, 828, and 829 are disposed in this order in the longitudinal direction of the piezoelectric 92.

The external-connection conductor pattern 826 is disposed in proximity to the conductor pattern 922 used for a parallel-arm resonant circuit. The external-connection conductor pattern 826 is connected to the wiring conductor pattern 846. The external-connection conductor pattern 827 is disposed in proximity to the conductor pattern 942 used for a parallel-arm resonant circuit. The external-connection conductor pattern 827 is connected to the wiring conductor pattern 849. The external-connection conductor pattern 828 is disposed in proximity to the conductor pattern 962 used for a parallel-arm resonant circuit. The external-connection conductor pattern 828 is connected to the wiring conductor pattern 853. The external-connection conductor pattern 829 is disposed in proximity to the conductor pattern 982 used for a parallel-arm resonant circuit. The external-connection conductor pattern 829 is connected to the wiring conductor pattern 856.

The external-connection conductor patterns 826, 827, 828, and 829 are respectively connected to the switching circuits SW13, SW15, SW17, and SW19, which are disposed adjacent to the other lateral end of the piezoelectric 92.

Employing the above-mentioned configuration ensures that a wiring pattern constituting a series-arm resonant circuit, and a wiring pattern constituting a parallel-arm resonant circuit are disposed with the piezoelectric 91 or 92 interposed therebetween. This helps minimize electrical coupling between a wiring pattern constituting a series-arm resonant circuit and a wiring pattern constituting a parallel-arm resonant circuit, thus allowing desired filter characteristics to be obtained with greater reliability and accuracy.

In accordance with the fifth embodiment, each piezoelectric is provided with a collection of a plurality of sets of series-arm and parallel-arm resonant circuits that may be brought into conduction or shut off simultaneously by switching of switching circuits. This simplifies the patterns of connection to the switching circuits. This also helps simplify and shorten the wiring patterns forming the ladder network, thus allowing desired filter characteristics to be obtained with greater reliability and accuracy.

Although the foregoing description of the fifth embodiment is directed to an implementation that uses two piezoelectrics, in an alternative implementation, all acoustic wave resonators may be provided on a single piezoelectric. Further, the tunable filter 10D according to the fifth embodiment is based on the circuit configuration of the tunable filter 10A according to the second embodiment. In this regard, the same circuit configuration may be also employed for tunable filters and tunable branching circuits according to other embodiments.

In accordance with the above embodiments, if an acoustic wave resonant circuit is to be provided with a plurality of acoustic wave resonators, these acoustic wave resonators are connected in parallel. In an alternative implementation, these acoustic wave resonators may be connected in series. However, use of a parallel connection of acoustic wave resonators helps minimize an increase in the impedance of the acoustic wave resonant circuit, which proves advantageous for low-impedance circuits such as a radio frequency front-end circuit that connects to an antenna. Conversely, a series circuit of acoustic wave resonators may be employed for high-impedance circuits.

In accordance with the above embodiments, if an acoustic wave resonant circuit is to be provided with a plurality of acoustic wave resonators, such an acoustic wave resonant circuit is provided with two acoustic wave resonators. In an alternative implementation, an acoustic wave resonant circuit may include three or more acoustic wave resonators.

In accordance with the above embodiments, a selection unit for selecting an acoustic wave resonant circuit is included in both the series-arm resonant circuit and the parallel-arm resonant circuit. In this regard, it suffices that such a selection unit for selecting an acoustic wave resonant circuit be included in at least one of the series-arm resonant circuit and the parallel-arm resonant circuit.

Figure 12:
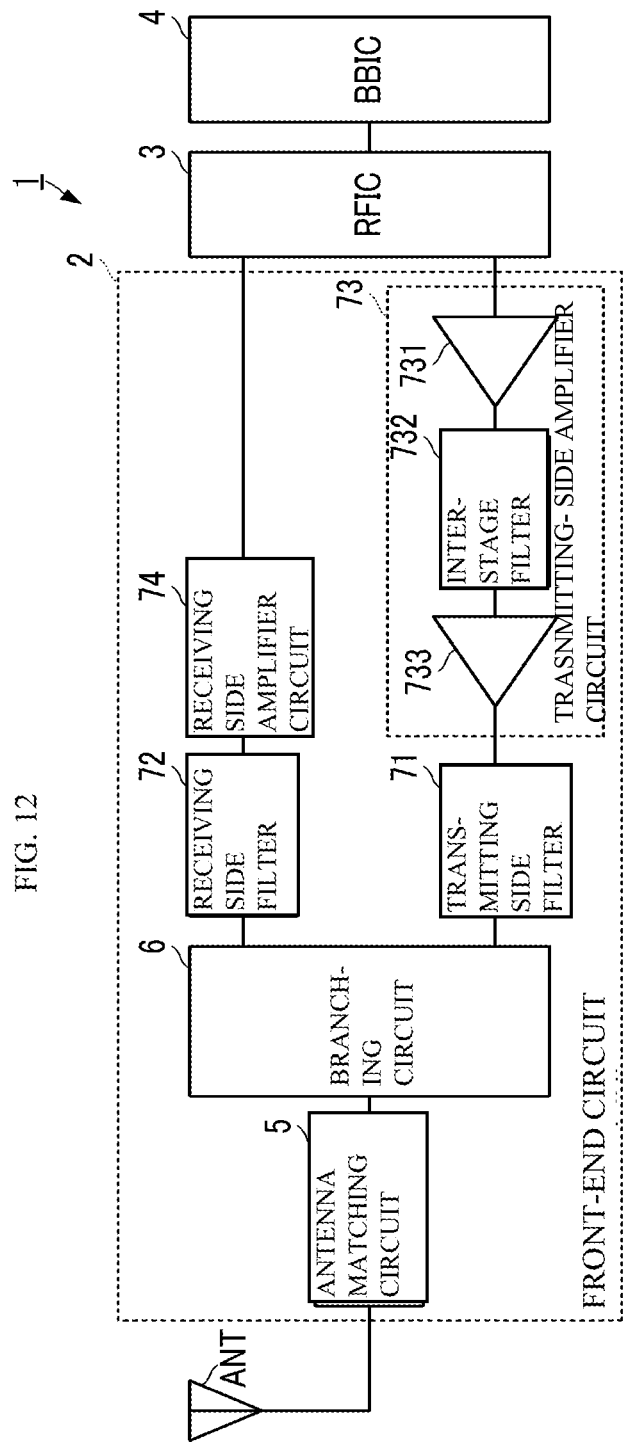
FIG. 12 is a functional block diagram of a communication apparatus according to an embodiment of the present disclosure.

The tunable filter having the above-mentioned configuration may be used for a front-end circuit and a communication apparatus that will be described below. FIG. 12 is a functional block diagram of a communication apparatus according to an embodiment of the present disclosure.

A communication apparatus 1 includes a front-end circuit 2, a radio frequency integrated circuit (RFIC) 3, and a baseband frequency integrated circuit (BBIC) 4. The front-end circuit 2 includes an antenna matching circuit 5, a branching circuit 6, a transmitting-side filter 71, a receiving-side filter 72, a transmitting-side amplifier circuit 73, and a receiving-side amplifier circuit 74. The transmitting-side filter 71 and the transmitting-side amplifier circuit 73 correspond to "transmitting circuit" according to the present disclosure. The receiving-side filter 72 and the receiving-side amplifier circuit 74 correspond to "receiving circuit" according to the present disclosure.

The antenna matching circuit 5 is connected between an antenna ANT and the branching circuit 6. The branching circuit is connected to the antenna matching circuit 5, and also connected to the transmitting-side filter 71 and the receiving-side filter 72. The transmitting-side filter 71 is interconnected to the transmitting-side amplifier circuit 73. The receiving-side filter 72 is connected to the receiving-side amplifier circuit 74. The transmitting-side amplifier circuit 73 and the receiving-side amplifier circuit 74 are connected to the RFIC 3. The RFIC 3 is connected to the BBIC 4.

The RFIC 3 executes radio-frequency communication processes to be executed by the communication apparatus 1. Specific examples of such radio-frequency communication processes include generation of a transmit signal, and demodulation of a receive signal. The BBIC 4 executes baseband-frequency processes to be executed by the communication apparatus 1.

A transmit signal output from the RFIC 3 is amplified by the transmitting-side amplifier circuit 73. The transmitting-side amplifier circuit 73 includes a first-stage amplifier circuit 731, an inter-stage filter 732, and a last-stage amplifier circuit 733. The transmit signal is amplified by the first-stage amplifier circuit 731, filtered through the inter-stage filter 732, and further amplified by the last-stage amplifier circuit 733 before being output to the transmitting-side filter 71. The transmit signal is then filtered through the transmitting-side filter 71, and output to the branching circuit 6. The transmit signal is transferred to the antenna ANT via the branching circuit 6 and the antenna matching circuit 5, and transmitted to the outside from the antenna ANT.

A receive signal received by the antenna ANT is output to the receiving-side filter 72 via the antenna matching circuit 5 and the branching circuit 6. The receive signal is filtered through the receiving-side filter 72, and output to the receiving-side amplifier circuit 74. The receiving-side amplifier circuit 74 amplifies the receive signal, and outputs the resulting signal to the RFIC 3.

For the communication apparatus 1 and the front-end circuit 2 configured as described above, the tunable filter 10, 10A, 10B, 10C, or 10D having the above-mentioned configuration is used as at least one of the transmitting-side filter 71, the receiving-side filter 72, and the inter-stage filter 732.

This makes it possible to extend the tunable range of the pass-band center frequency of such a filter, thus providing the front-end circuit 2 that transmits and receives communication signals of desired frequencies with low loss while reducing unwanted waves at other frequencies across many different communication bands. This makes it possible to provide the communication apparatus 1 that exhibits superior communication characteristics (with fewer transmission errors or reception errors) across many different communication bands.

Figure 13:
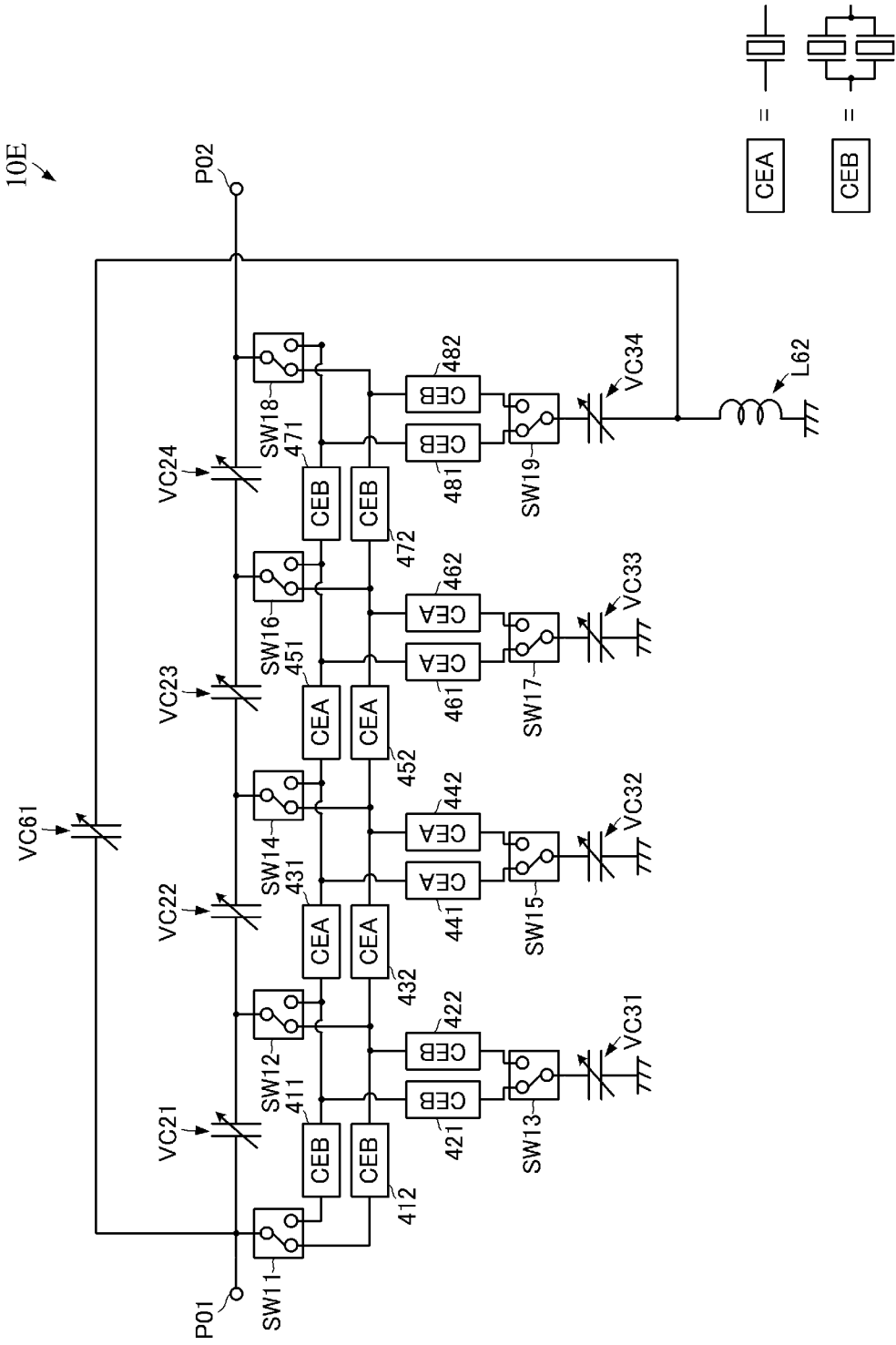
FIG. 13 is a circuit diagram of a tunable filter representing a modification of the tunable filter according to the second embodiment of the present disclosure.

Next, FIG. 13 is a circuit diagram of a tunable filter 10E, which represents a modification of the tunable filter 10A according to the second embodiment of the present disclosure. The tunable filter 10E according to this modification is obtained by adding a coupling variable capacitor VC61 and an inductor L62 to the tunable filter 10A. Accordingly, overlapping configuration will not be described.

As illustrated in FIG. 13, the inductor L62 (corresponding to a reactance element) is connected between the variable capacitor VC34 and the ground potential. That is, the inductor L62 is connected between the ground potential, and the variable capacitor VC34 of a parallel-arm resonant circuit (a circuit including the acoustic wave resonant circuits 481 and 482, and the variable capacitor VC34) that is connected to the second terminal P02 without necessarily a series-arm resonant circuit (a circuit including the acoustic wave resonant circuits 411, 412, 431, 432, 451, 452, 471, and 472, and the variable capacitors VC21 to VC24) interposed between the parallel-arm resonant circuit and the second terminal P02. The coupling variable capacitor VC61 is connected between the connection point of the variable capacitor VC34 and the inductor L62, and the first terminal P01.

The coupling variable capacitor VC61 of the tunable filter 10E according to this modification is coupled to another variable capacitor, or a reactance element. Thus, with regard to the bandpass characteristics of the tunable filter 10E, the attenuation pole at the lower frequency side of the pass band is adjusted. This results in improved attenuation characteristics of the tunable filter 10E. This improvement in attenuation characteristics will be described below with reference to FIG. 14.

Figure 14:
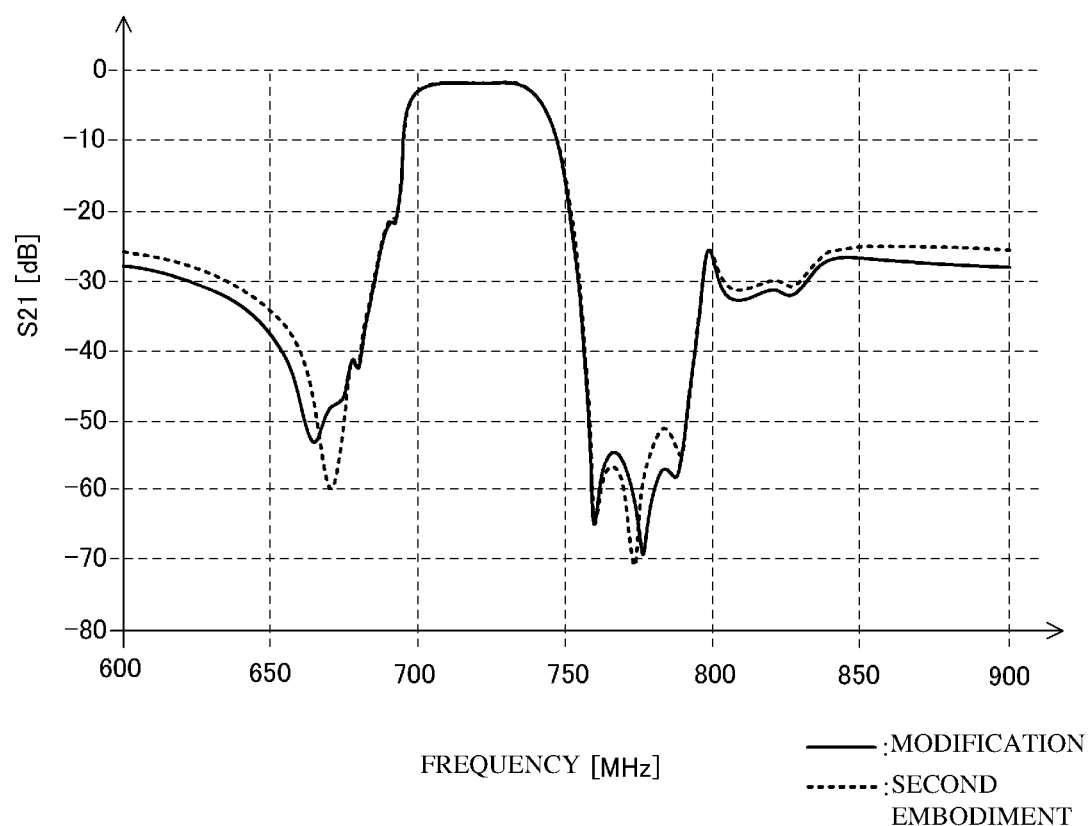
FIG. 14 illustrates the bandpass characteristics of the tunable filter according to the modification.

FIG. 14 illustrates the respective bandpass characteristics (attenuation characteristics) of the tunable filters 10E and 10A. In FIG. 14, the solid line represents the bandpass characteristics of the tunable filter 10E, and the dotted line represents the bandpass characteristics of the tunable filter 10A.

As illustrated in FIG. 14, in the pass band from about 690 MHz to about 730 MHz, the tunable filter 10E provides an amount of attenuation (dB) substantially equal to the amount of attenuation provided by the tunable filter 10A. That is, as with the tunable filter 10A, the tunable filter 10E passes radio frequency signals in the pass band with low loss.

As illustrated in FIG. 14, the tunable filter 10E has bandpass characteristics such that an attenuation pole occurs at a frequency of about 670 MHz at the lower frequency side of the pass band. In the band of frequencies from 670 MHz, which is the frequency of this attenuation pole, to 600 MHz, the tunable filter 10E provides an amount of attenuation greater than the amount of attenuation provided by the tunable filter 10A. Thus, with the tunable filter 10E, the attenuation band that provides a predetermined amount of attenuation may be extended at the lower frequency side of the pass band.

Figure 15:
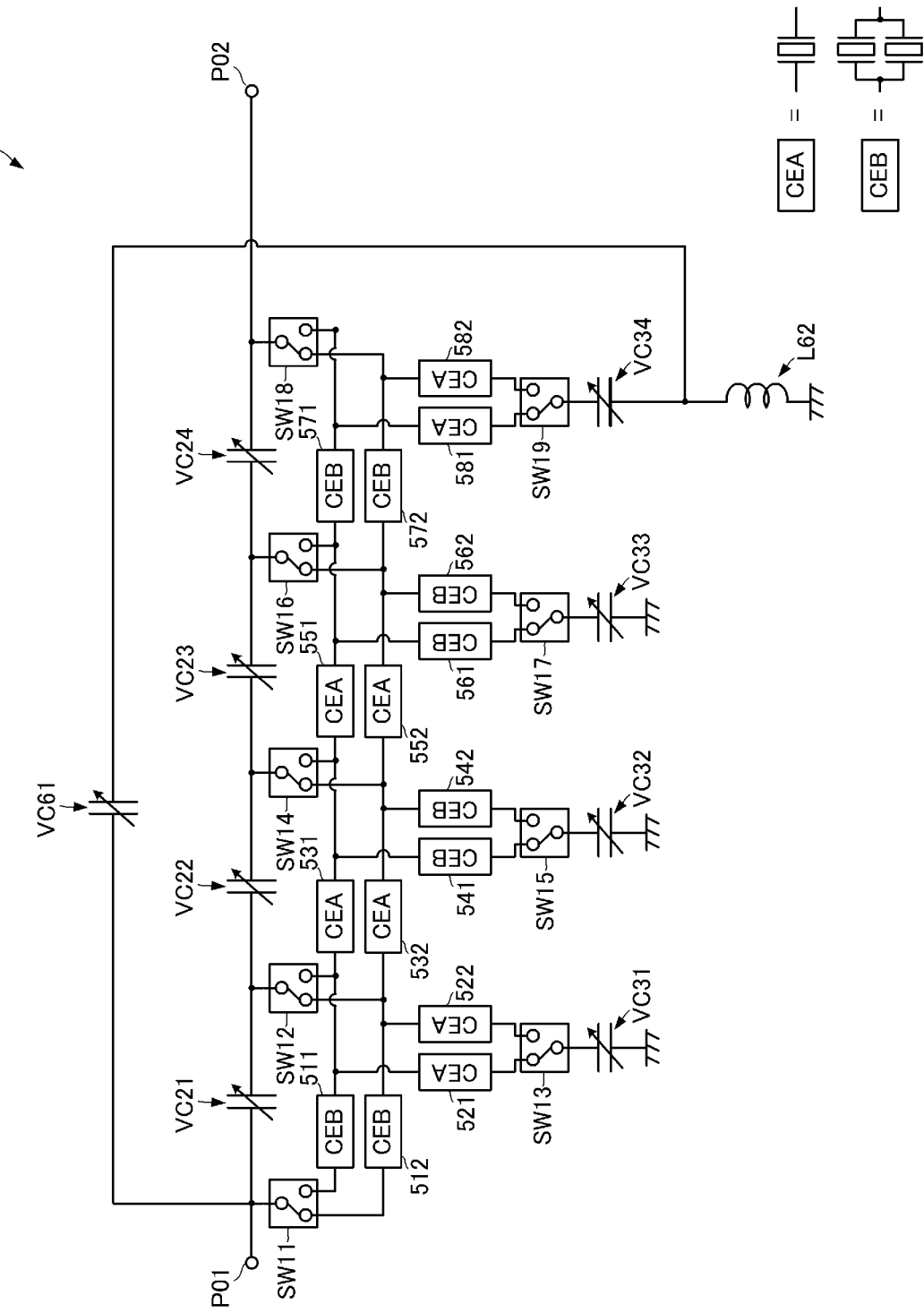
FIG. 15 is a circuit diagram of a tunable filter representing a modification of the tunable filter according to the third embodiment of the present disclosure.

The coupling variable capacitor VC61 may be employed for tunable filters other than the tunable filter 10A according to the second embodiment of the present disclosure. For example, FIG. 15 is a circuit diagram of a tunable filter 10F, which represents a modification of the tunable filter 10B according to the third embodiment of the present disclosure. For the tunable filter 10F as well, the inductor L62 is connected between the variable capacitor VC34 and the ground potential. The coupling variable capacitor VC61 is connected between the connection point of the variable capacitor VC34 and the inductor L62, and the first terminal P01. Thus, with the tunable filter 10F as well, the attenuation band that provides a predetermined amount of attenuation may be extended at the lower frequency side of the pass band.

REFERENCE SIGNS LIST

1: communication apparatus
2: front-end circuit
3: RFIC
4: BBIC
5: antenna matching circuit
6: branching circuit
10, 10A, 10B, 10C, 10D, 10E, 10F: tunable filter
11: tunable branching circuit
20: series-arm resonant circuit
21, 22, 23, 31, 32, 33, 411, 412, 421, 422, 431, 432, 441, 442, 451, 452, 461, 462, 471, 472, 481, 482, 511, 512, 521, 522, 531, 532, 541, 542, 551, 552, 561, 562, 571, 572, 581, 582, 611, 612, 621, 622, 631, 632, 641, 642, 651, 652, 661, 662, 671, 672, 681, 682: acoustic wave resonant circuit
30: parallel-arm resonant circuit
71: transmitting-side filter
72: receiving-side filter
73: transmitting-side amplifier circuit
74: receiving-side amplifier circuit
91, 92: piezoelectric
731: first-stage amplifier circuit
732: inter-stage filter
733: last-stage amplifier circuit
811, 812, 813, 814, 815, 816, 817, 818, 819, 821, 822, 823, 824, 825, 826, 827, 828, 829: external-connection conductor pattern
831, 832, 833, 834, 835, 836, 837, 838, 839, 841, 842, 843, 844, 845, 846, 847, 848, 849, 851, 852, 853, 854, 855, 856: wiring conductor pattern
911, 931, 951, 971, 912, 932, 952, 972: conductor pattern used for a series-arm resonant circuit
921, 941, 961, 981, 922, 942, 962, 982: conductor pattern used for a parallel-arm resonant circuit
P01: first terminal
P02: second terminal
Pant: antenna terminal
Prx: receive-signal output terminal
Ptx: transmit-signal input terminal
SW1, SW2, SW3, SW11, SW12, SW13, SW14, SW15, SW16, SW17, SW18, SW19, SW20, SW21, SW22, SW23, SW24, SW25, SW26, SW27, SW28, SW29: switching circuit
VC20, VC30, VC21, VC22, VC23, VC24, VC31, VC32, VC33, VC34, VC41, VC42, VC43, VC44, VC51, VC52, VC53, VC54, VC61: variable capacitor
L62: inductor

The invention claimed is:

1. A tunable filter having a tunable range of pass-band frequencies comprising:
a series-arm resonant circuit; and
a parallel-arm resonant circuit,
wherein the series-arm resonant circuit and the parallel resonant arm circuit are connected in a ladder network,
wherein the series-arm resonant circuit and the parallel-arm resonant circuit each comprise at least one acoustic wave resonator and a variable capacitor,
wherein one of the series-arm resonant circuit and the parallel-arm resonant circuit comprises:
a first acoustic wave resonant circuit and a second acoustic wave resonant circuit, a resonant frequency of the first acoustic wave resonant circuit being different than a resonant frequency of the second acoustic wave resonant circuit, and
a switching circuit configured to selectively connect the first acoustic wave resonant circuit or the second acoustic wave resonant circuit to the variable capacitor, the filter having a first pass-band frequency when the variable capacitor is selectively connected to the first acoustic wave resonant circuit and a second pass-band frequency when the variable capacitor is selectively connected to the second acoustic wave resonant circuit,
wherein the first pass-band frequency is based on the resonant frequency of the first acoustic wave resonant circuit and a variable capacitance range of the variable capacitor, and the second pass-band frequency is based on the second acoustic wave resonant circuit and the variable capacitance range of the variable capacitor,
wherein a difference between the first pass-band frequency and the second pass-band frequency due to the different resonant frequencies of the first acoustic wave resonant circuit and the second acoustic wave resonant circuit is greater than a maximum difference between the first pass-band frequency and the second pass-band frequency due to the variable capacitance range of the variable capacitor, and
wherein the tunable filter further comprises:
a reactance element connected between a ground potential and the variable capacitor of the parallel-arm resonant circuit; and a coupling variable capacitor connected between an input terminal of the tunable filter and a node between the variable capacitor and the reactance element, wherein the parallel-arm circuit is connected to an output terminal of the tunable filter without the series-arm resonant circuit interposed between the parallel-arm resonant circuit and the output terminal.

2. The tunable filter according to claim 1, wherein the variable capacitor is configured to be adjusted if the tunable range of pass-band frequencies is equal to or less than a maximum difference between the first pass-band frequency and the second pass-band frequency due to a maximum variable capacitance range of the variable capacitor, and wherein the switching circuit is configured to switch connection of the variable capacitor between the first acoustic wave resonant circuit and the second acoustic wave resonant circuit if the tunable range of the pass-band frequencies is greater than a maximum difference between the first pass-band frequency and the second pass-band frequency due to the maximum variable capacitance range of the variable capacitor.

3. The tunable filter according to claim 2, wherein the first acoustic wave resonant circuit or the second acoustic wave resonant circuit comprises a first acoustic wave resonator and a second acoustic wave resonator, wherein the first acoustic wave resonator and the second acoustic wave resonator are connected in parallel, and wherein the first acoustic wave resonator has a different resonant frequency and anti-resonant frequency than the second acoustic wave resonator.

4. The tunable filter according to claim 3, wherein another of the first acoustic wave resonant circuit and the second acoustic wave resonant circuit comprises a third acoustic wave resonator and a fourth acoustic wave resonator, wherein the third acoustic wave resonator and the fourth acoustic wave resonator are connected in parallel, and wherein the third acoustic wave resonator has a different resonant frequency and anti-resonant frequency than the fourth acoustic wave resonator.

5. The tunable filter according to claim 3, wherein another of the series-arm resonant circuit and the parallel-arm resonant circuit comprises:

a third acoustic wave resonant circuit and a fourth acoustic wave resonant circuit, a resonant frequency of the third acoustic wave resonant circuit being different than a resonant frequency of the fourth acoustic wave resonant circuit.

6. The tunable filter according to claim 2, wherein another of the series-arm resonant circuit and the parallel-arm resonant circuit comprises:

a third acoustic wave resonant circuit and a fourth acoustic wave resonant circuit, a resonant frequency of the third acoustic wave resonant circuit being different than a resonant frequency of the fourth acoustic wave resonant circuit.

7. The tunable filter according to claim 1, wherein a conductor pattern of an acoustic wave resonator constituting the series-arm resonant circuit and a conductor pattern of an acoustic wave resonator constituting the parallel-arm resonant circuit are arranged in a first direction on a piezoelectric, wherein an external-connection terminal conductor that connects the series-arm resonant circuit to the conductor pattern of the acoustic wave resonator constituting the series-arm resonant circuit is disposed adjacent to one end of a resonator-forming area with respect to a second direction, the second direction being orthogonal to the first direction, wherein the resonator-forming area is an area of the piezoelectric where the conductor pattern of the acoustic wave resonator constituting the series-arm resonant circuit and the conductor pattern of the acoustic wave resonator constituting the parallel-arm resonant circuit are formed, and wherein an external-connection terminal conductor that connects the parallel-arm resonant circuit to the conductor pattern of an acoustic wave resonator constituting the parallel-arm resonant circuit is disposed adjacent to another end of the resonator-forming area with respect to the second direction.

8. A radio frequency front-end circuit comprising the tunable filter according to claim 1, wherein the tunable filter is a filter of a transmitting circuit or a filter of a receiving circuit.

9. A communication apparatus comprising:

the radio frequency front-end circuit according to claim 8; and a radio frequency integrated circuit connected to the transmitting circuit and the receiving circuit.

* * * * *